United States Patent
Strong

(10) Patent No.: US 12,431,898 B2
(45) Date of Patent: Sep. 30, 2025

(54) LONG JOSEPHSON JUNCTION LOGIC GATE SYSTEMS

(71) Applicant: NORTHROP GRUMMAN SYSTEMS CORPORATION, Falls Church, VA (US)

(72) Inventor: Joshua A. Strong, Ellicott City, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 183 days.

(21) Appl. No.: 18/358,582

(22) Filed: Jul. 25, 2023

(65) Prior Publication Data

US 2025/0038745 A1    Jan. 30, 2025

(51) Int. Cl.
*H03K 17/92* (2006.01)
*H03K 19/21* (2006.01)

(52) U.S. Cl.
CPC ............. *H03K 17/92* (2013.01); *H03K 19/21* (2013.01)

(58) Field of Classification Search
CPC .............................. H03K 17/92; H03K 19/21
USPC .................................. 326/3; 333/32; 327/367
See application file for complete search history.

(56) References Cited

U.S. PATENT DOCUMENTS

| 7,782,077 B2 | 8/2010 | Herr et al. |
| 10,778,229 B1 | 9/2020 | Osborn et al. |
| 11,791,525 B1 * | 10/2023 | Osborn ............... H03K 19/195 377/64 |
| 2003/0001606 A1 | 1/2003 | Furuta et al. |
| 2013/0001588 A1 | 1/2013 | Naaman et al. |
| 2020/0035000 A1 | 1/2020 | Raut et al. |

FOREIGN PATENT DOCUMENTS

JP    H10-104318 A1    4/1998

OTHER PUBLICATIONS

IEEE Transactions on Applied Superconductivity, vol. 31, No. 2, Mar. 2021 1300213 Reversible Fluxon Logic With Optimized CNOT Gate Components Kevin D. Osborn , Member, IEEE, and Waltraut Wustmann (Year: 2021).*
Takeuchi, et al.: "An adiabatic superconductor 8-bit adder with 24kBT energy dissipation per junction"; Appl. Phys. Lett. 114, 042602 (2019); https://doi.org/10.1063/1.5080753.
Ustinov: "Solutions in Josephson junctions"; Physica D 123 (1998) 315-329.

(Continued)

*Primary Examiner* — Arnold M Kinkead
(74) *Attorney, Agent, or Firm* — Tarolli, Sundheim, Covell &Tummino LLP

(57) ABSTRACT

One example includes a long Josephson junction gate system. The system includes at least one input long Josephson junction (Josephson junction) configured to propagate a respective at least one input signal. The system also includes a long Josephson junction gate comprising at least one gate long Josephson junction configured to provide a logic operation based on the at least one input signal and to provide at least one output signal. The system further includes at least one output long Josephson junction configured to propagate the respective at least one output signal.

17 Claims, 7 Drawing Sheets

(56) References Cited

OTHER PUBLICATIONS

Ren, et al. "Progress With Physically and Logically Reversible Superconducting Digital Circuits"; IEEE Transactions on Appiled Superconductivity, vol. 21, No. 3, Jun. 2011.
Takeuchi, et al.—2: "Reversible logic gate using adiabatic superconducting devices"; Scientific Reports, published Sep. 15, 2014; 4 : 6354 | DOI: 10.1038/srep06354; pp. 1-4.
Wustmann, et al.: "Reversible fluxon logic: Topological particles allow ballistic gates along one-dimensional paths"; Physical Review B 101, 014516 (2020).
Osborn, et al.: "Ballistic reversible gates matched to bit storage: Plans for an efficient CNOT gate using fluxons"; arXiv:1806.08011v1 [cond-mat.mes-hall] Jun. 20, 2018.
Fredkin, et al.: "Conservative Logic"; International Journal of Theoretical Physics, vol. 21, Nos. 3/4, 1982.
Frank, et al.: "Asynchronous Ballistic Reversible Fluxon Logic"; IEEE Transactions on Applied Superconductivity, vol. 29, No. 5, Aug. 2019.

* cited by examiner

LONG JOSEPHSON JUNCTION LOGIC GATE SYSTEMS

TECHNICAL FIELD

The present invention relates generally to computer systems, and specifically to long Josephson junction logic gate systems.

BACKGROUND

Superconducting digital technology has provided computing and/or communications resources that benefit from unprecedented high speed, low power dissipation, and low operating temperature. Superconducting digital technology has been developed as an alternative to CMOS technology, and typically comprises superconductor based single flux superconducting circuitry, utilizing superconducting Josephson junctions, and can exhibit typical signal power dissipation of less than 1 nW (nanowatt) per active device at a typical data rate of 20 Gb/s (gigabytes/second) or greater, and can operate at temperatures of around 4 or fewer Kelvin.

The propagation of data in superconducting systems can be based on the propagation of pulses, such as resulting from the triggering of Josephson junctions in response to a current through the Josephson junction exceeding a critical current threshold. In one example, the pulses generated from the triggering of a Josephson junction can be discrete and timed to propagate along a Josephson transmission line, such as based on a bias provided at individual phases of a clock signal. As another example, the pulse can propagate as a soliton along a long Josephson junction. A long Josephson junction can be fabricated as discrete superconducting quantum interference devices (SQUIDs) having a set of Josephson junctions separated by an inductor. The sequence of multiple discrete SQUIDs can thus propagate the soliton based on the Josephson junctions having a low critical current with a minimal inductance therebetween.

SUMMARY

One example includes a long Josephson junction gate system. The system includes at least one input long Josephson junction (Josephson junction) configured to propagate a respective at least one input signal. The system also includes a long Josephson junction gate comprising at least one gate long Josephson junction configured to provide a logic operation based on the at least one input signal and to provide at least one output signal. The system further includes at least one output long Josephson junction configured to propagate the respective at least one output signal.

Another example includes a method for performing a logic operation via a long Josephson junction gate system. The method includes providing an enable soliton pulse on one of an enable input long Josephson junction and a complementary not enable input long Josephson junction and providing a data soliton pulse on one of a first input long Josephson junction and a second input long Josephson junction. The method also includes performing the logic operation based on the enable soliton pulse and the data soliton pulse via at least one gate long Josephson junction to provide at least one output soliton pulse. The method further includes providing the at least one output soliton pulse on one of a plurality of output long Josephson junctions.

Another example includes a long Josephson junction gate system. The system includes a pair of complementary long Josephson junctions corresponding respectively to an enable input and a not enable input. One of the pair of complementary long Josephson junctions is configured to receive an enable soliton pulse. The system also includes a plurality of input data long Josephson junctions configured to propagate a respective plurality of input signals. Each of the input signals can be arranged as a soliton pulse in a first logic state and as no soliton pulse in a second logic state. A data soliton pulse is provided on one of the input data long Josephson junctions. The system also includes a long Josephson junction gate comprising a plurality of gate long Josephson junctions configured to provide a logic operation on the input signals based on a bias provided by one of the enable input or the not enable input to the gate long Josephson junctions to provide a plurality of output signals. The system further includes a plurality of output long Josephson junctions configured to propagate the respective output signals. At least one of the output signals can be provided as an output soliton pulse.

DETAILED DESCRIPTION

Figure 1:
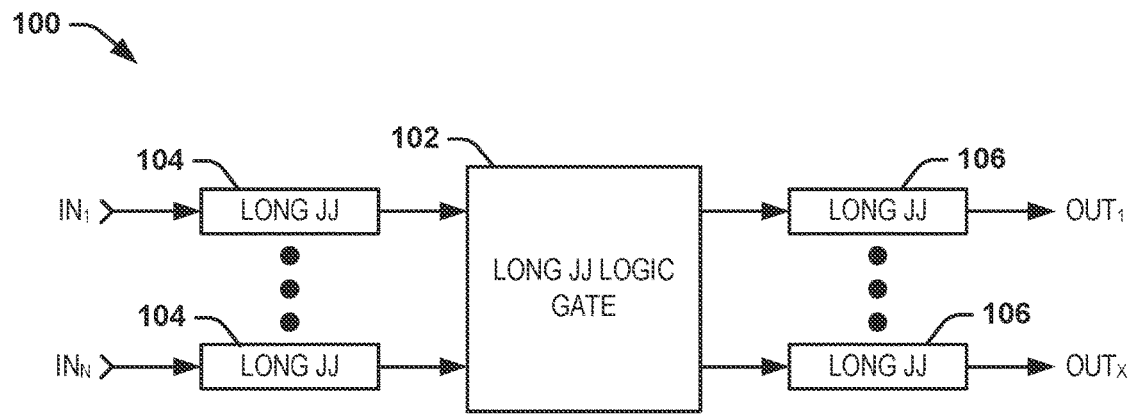
FIG. 1 illustrates an example of a long Josephson junction gate system.

The present invention relates generally to computer systems, and specifically to long Josephson junction logic gate systems. The long Josephson junction logic gate system can correspond to a logic gate that is formed from long Josephson junctions (Josephson junctions) in a superconducting circuit. As described herein, the long Josephson junction logic gate system includes inputs, a logic gate, and outputs that are all fabricated as long Josephson junctions, such that logic operations are provided by the long Josephson junction logic gate system based on the propagation of soliton pulses through the long Josephson junction logic gate system. The long Josephson junction logic gate system can be fabricated such that the input long Josephson junctions, the gate long Josephson junctions that constitute the logic gate, and the output long Josephson junctions can be coupled to provide contiguous long Josephson junctions through the long Josephson junction logic gate system, such that a soliton pulse provided on one of the long Josephson junction inputs propagates through a contiguous long Josephson junction formed from one of the input long Josephson junctions, one of the gate long Josephson junctions, and one of the output long Josephson junctions.

The long Josephson junction logic gate system can be configured to provide any of a variety of logic operations. As an example, two of the input long Josephson junctions can be arranged as a complementary pair of an enable input and a not enable input. An enable soliton pulse provided on one of the complementary pairs of input long Josephson junctions can thus provide a bias to one or more of the other input long Josephson junctions, such as to select a propagation path for a data soliton pulse that is provided on one of the other input long Josephson junctions. In this manner, basic reversible logic gates can be fabricated with long Josephson junctions. As a first example, the long Josephson junction logic gate system can be or can include a switch gate that allows selection for a soliton pulse provided at one input long Josephson junction to be provided on one of a plurality of coupled output long Josephson junctions. As a second example, the long Josephson junction logic gate system can be or can include a merge gate that allows a soliton pulse that is provided at one of a plurality of input long Josephson junctions to be provided on one coupled output long Josephson junction.

As another example, the long Josephson junction logic gate system can include more than one reversible logic gates to provide more complex and traditional logic operations. For example, by including multiple reversible logic gates (e.g., switch gates and/or merge gates), the long Josephson junction logic gate system can be configured as one of a logic AND gate, a logic OR gate, or a logic XOR gate. In this manner, a subset of one of the input long Josephson junctions, such as including one of the complementary enable input long Josephson junctions, can correspond to inputs of the logic gate on which logic input signals are provided. Similarly, one of the output long Josephson junctions can correspond to an output of the logic gate on which a logic output signal resulting from the logic operation is provided. The input and output signals can be provided as a soliton pulse corresponding to a first logic state, and no soliton pulse corresponding to a second logic state. In this manner, the long Josephson junction logic gate system can provide logic functions in superconducting circuits without significant power consumption from clock biases, as opposed to logic gates that operate based on Josephson transmission lines (JTLs).

FIG. 1 illustrates an example of a long Josephson junction logic gate system 100. The long Josephson junction gate system 100 can be implemented in any of a variety of superconducting circuits to provide a logical operation (e.g., logic AND, logic OR, logic XOR, etc.). The long Josephson junction gate system 100 includes a long Josephson junction logic gate 102 that is configured to implement a logic operation in response to input signals $IN_1$ through INN, where N is a positive integer greater than one. In the example of FIG. 1, the input signals $IN_1$ through INN are provided via input long Josephson junctions 104 to the long Josephson junction logic gate 102, such that the long Josephson junction logic gate 102 provides the respective logic operation to provide output signals $OUT_1$ through $OUT_Z$, where Z is a positive integer greater than one. The output signals $OUT_1$ through $OUT_Z$ are thus provided from the long Josephson junction gate 102 via respective output long Josephson junctions 106.

As an example, the input long Josephson junctions 104, the long Josephson junctions that constitute the long Josephson junction logic gate 102, and the output long Josephson junctions 106 can be formed as continuous long Josephson junctions. Examples of the continuous long Josephson junctions that can form the long Josephson junction gate system 100 can be found in U.S. patent application 18/358,603, which is incorporated herein by reference in its entirety.

As described herein, the term "signal" with respect to the input signals $IN_1$ through INN and the output signals $OUT_1$ through $OUT_Z$ refers to the propagation of a soliton pulse or the lack of a soliton pulse. As an example, the presence of a soliton can correspond to a first logic state (e.g., a logic-one) and the lack of a soliton can correspond to a second logic state (e.g., a logic-zero). However, the logic operation can be predicated on the presence of at least one soliton propagating on a respective at least one of the input long Josephson junctions 104. For example, a soliton provided on one of the input long Josephson junctions 104 can provide an enable, such as to select a long Josephson junction propagation path of another soliton through the long Josephson junction logic gate 102. As another example, one or more pairs of the input long Josephson junctions 104 and one or more pairs of the output long Josephson junctions 106 can be complements with respect to each other. Therefore, to provide the logic operation via the long Josephson junction logic gate 102, the input long Josephson junctions 104 can provide at least one soliton to the long Josephson junction logic gate 102, and the long Josephson junction logic gate 102 can output at least one soliton via the output long Josephson junctions 106, regardless of the logic inputs and logic outputs of the logic operation.

Based on the formation of the long Josephson junction gate system 100 as the long Josephson junctions input 104 coupled as inputs to the long Josephson junction logic gate 102, and the output long Josephson junctions 106 coupled as outputs from the long Josephson junction logic gate 102, then a soliton can propagate through the long Josephson junction gate system 100 along one continuous long Josephson junction. For example, one of the input long Josephson junctions 104, a selected one of the long Josephson junctions in the long Josephson junction logic gate 102, and one of the output long Josephson junctions 106 can be contiguously coupled to form a contiguous long Josephson junction through the long Josephson junction gate system 100. Therefore, a soliton provided at the respective one of the input long Josephson junctions 104 propagates through the contiguous long Josephson junction and from one of the output long Josephson junctions 106 to another part of the associated superconducting circuit. Accordingly, the entire operation of the long Josephson junction gate system 100 can be implemented by solitons propagating on long Josephson junctions.

Figure 2:
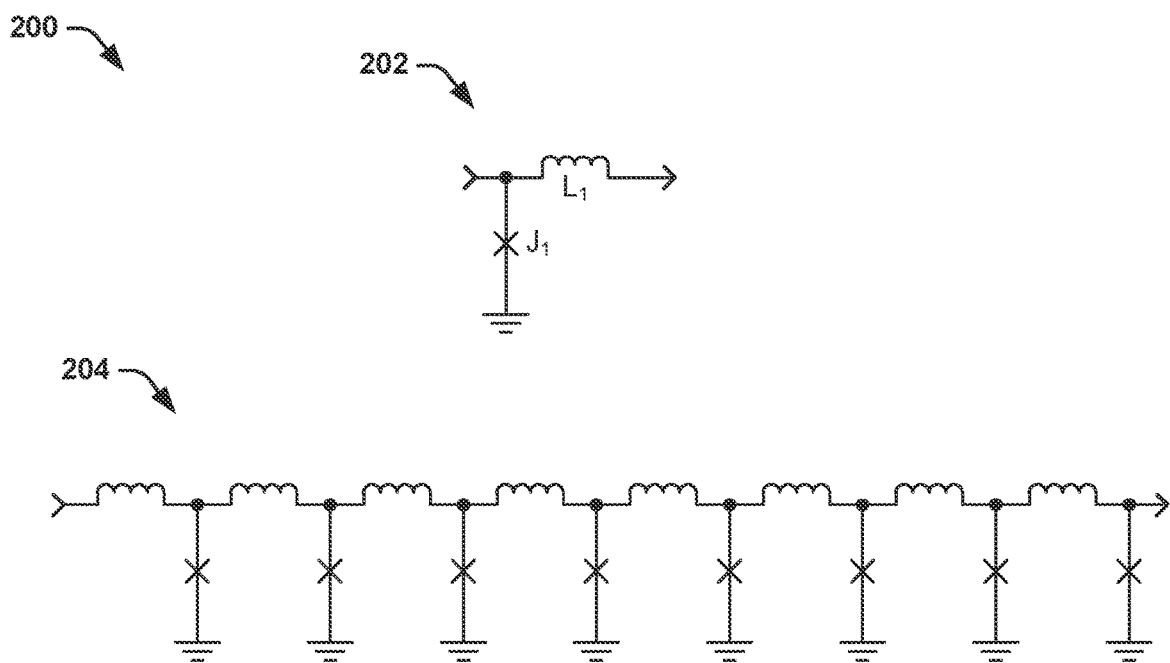
FIG. 2 illustrates an example diagram of a long Josephson junction.

FIG. 2 illustrates an example circuit diagram 200 of a long Josephson junction. The circuit diagram 200 includes a circuit diagram 202 that corresponds to a discrete portion of a long Josephson junction 204. The circuit diagram 202 includes a grounded Josephson junction $J_1$ and an inductor $L_1$ that is coupled to the grounded Josephson junction $J_1$. In the example of FIG. 2, the circuit diagram 202 of the discrete portion of the long Josephson junction includes an input 206 and an output 208 that each be coupled to other discrete portions of a long Josephson junction to form a complete long Josephson junction that is configured to propagate a soliton, as described herein. While the circuit diagram 202 includes only the grounded Josephson junction $J_1$ and the inductor $L_1$, additional inductance and resistance can be included in the discrete long Josephson junction, such as a resistance in parallel with the Josephson junction $J_1$ and/or an inductance that is representative of the Josephson inductance of the Josephson junction $J_1$.

Figures 3, 4:
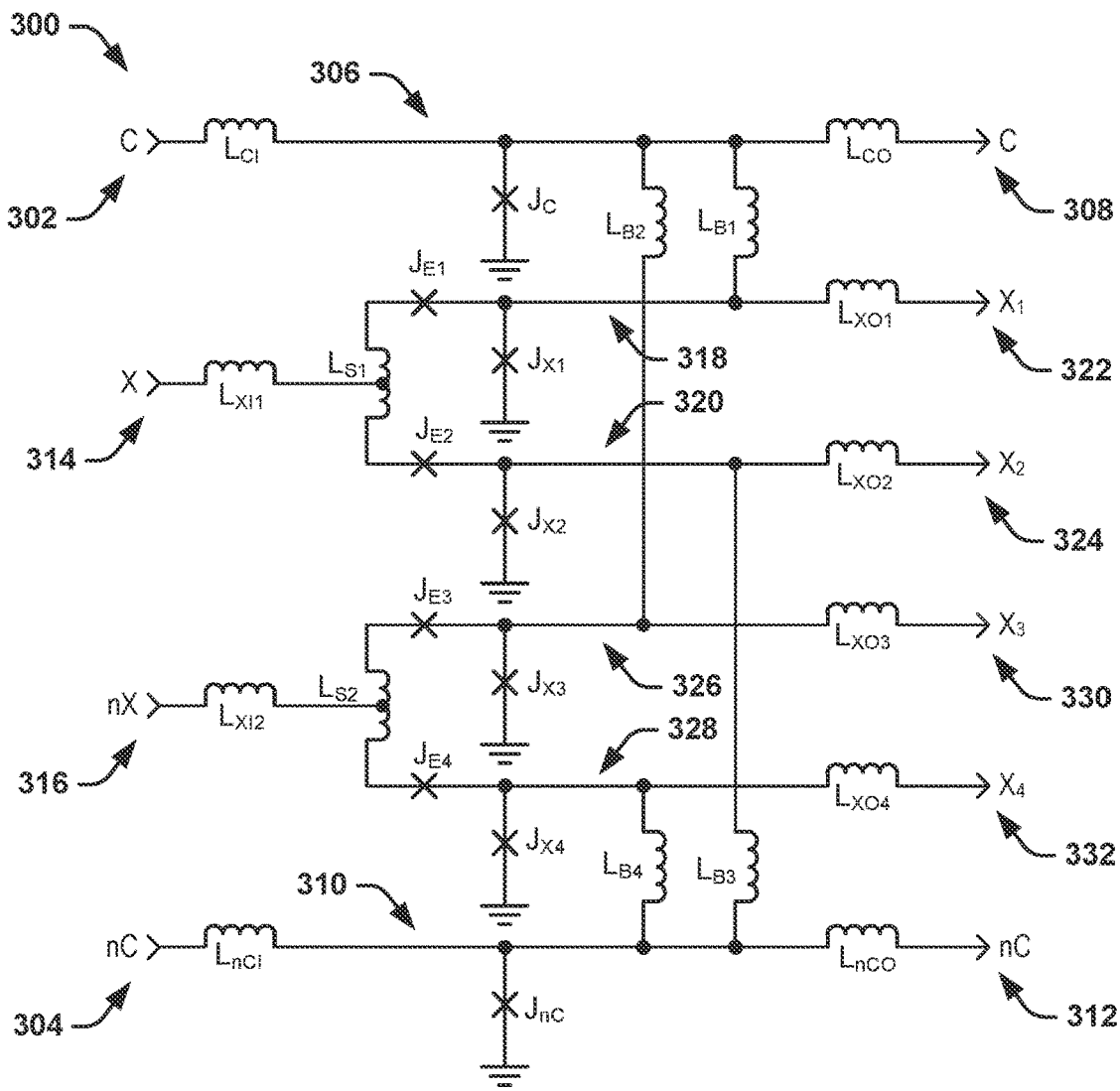
FIG. 3 illustrates an example of a long Josephson junction switch gate.
FIG. 4 illustrates an example of a truth table of a long Josephson junction switch gate.

FIG. 3 illustrates an example of a long Josephson junction switch gate 300. The long Josephson junction switch gate 300 can correspond to the long Josephson junction logic gate 102 in the example of FIG. 1, and can thus be formed from long Josephson junctions, similar to as demonstrated in the example of FIG. 2. Therefore, reference is to be made to the examples of FIGS. 1 and 2 in the following description of the example of FIG. 3.

The long Josephson junction switch gate 300 includes a first enable input 302 and a second enable input 304 that are configured to receive a signal C and a signal nC, respectively. The first and second enable inputs 302 and 304 can correspond to a complementary pair of enable signals, such that the signal C can correspond to an enable input and the signal nC can correspond to a not enable input. Therefore, one of the first and second enable inputs 302 and 304 can propagate an enable soliton pulse for a given logic (e.g., switch) operation. As an example, each of the first and second enable inputs 302 and 304 can be coupled to input long Josephson junctions, such as two of the input long Josephson junctions 104 in the example of FIG. 1. Therefore, the enable soliton pulse can be provided to one of the first and second enable inputs 302 and 304 from a respective one of the input long Josephson junctions 104.

The first enable input 302 is coupled to a propagation path 306 for a soliton pulse that is provided at the first enable input 302. The propagation path 306 includes an inductor $L_{CI}$, a grounded Josephson junction $J_C$, and an inductor $L_{CO}$. The inductor $L_{CO}$ is coupled to an output 308 that provides the enable signal C to an output long Josephson junction, such as one of the output long Josephson junctions 106. Similarly, the second enable input 304 is coupled to a propagation path 310 for a soliton pulse that is provided at the second enable input 304. The propagation path 310 includes an inductor $L_{nCI}$, a grounded Josephson junction $J_{nC}$, and an inductor $L_{nCO}$. The inductor $L_{nCO}$ is coupled to an output 312 that provides the not enable signal nC to an output long Josephson junction, such as a different one of the output long Josephson junctions 106. Therefore, the propagation paths 306 and 310 correspond to gate long Josephson junctions that are coupled between an input long Josephson junction and an output long Josephson junction.

The long Josephson junction switch gate 300 also includes a first data input 314 and a second data input 316 that are configured to receive a signal X and a signal nX. The first and second data inputs 314 and 316 can correspond to a complementary pair of data signals, such that the signals X and nX can have opposite logic states. Therefore, one of the first and second data inputs 314 and 316 can propagate a data soliton pulse for a given logic (e.g., switch) operation. As an example, each of the first and second data inputs 314 and 316 can be coupled to input long Josephson junctions, such as two of the input long Josephson junctions 104 in the example of FIG. 1. Therefore, the data soliton pulse can be provided to one of the first and second data inputs 314 and 316 from a respective one of the input long Josephson junctions 104.

The first data input 314 is coupled to an inductor $L_{X11}$ that is coupled to an inductor $L_{S1}$. The inductor $L_{S1}$ is coupled to a first propagation path 318 and a second propagation path 320 for a soliton pulse that is provided at the first data input 314. The first propagation path 318 includes an escape Josephson junction $J_{E1}$, a grounded Josephson junction $J_{X1}$, and an inductor $L_{XO1}$ and the second propagation path 320 includes an escape Josephson junction $J_{E2}$, a grounded Josephson junction $J_{X2}$, and an inductor $L_{XO2}$. The first propagation path 318 provides an output signal $X_1$ on an output 322 and the second propagation path 320 provides an output signal $X_2$ on an output 324. Therefore, as described in greater detail herein, the data soliton pulse that is provided to the first data input 314 as the data input signal X is provided as a data output signal $X_1$ or $X_2$ via a respective one of the first and second propagation paths 318 and 320 to a respective one of the outputs 322 and 324. Accordingly, the first and second propagation paths 318 and 320 correspond to gate long Josephson junctions that are coupled between an input long Josephson junction and an output long Josephson junction.

Similar to the first data input 314, the second data input 316 is coupled to an inductor $L_{X12}$ that is coupled to an inductor LS2. The inductor LS2 is coupled to a first propagation path 326 and a second propagation path 328 for a soliton pulse that is provided at the second data input 316. The first propagation path 326 includes an escape Josephson junction $J_{E3}$, a grounded Josephson junction $J_{X3}$, and an inductor $L_{XO3}$ and the second propagation path 328 includes an escape Josephson junction $J_{E4}$, a grounded Josephson junction $J_{X4}$, and an inductor $L_{XO4}$. The first propagation path 326 provides an output signal $X_3$ on an output 330 and the second propagation path 328 provides an output signal $X_4$ on an output 332. Therefore, as described in greater detail herein, the data soliton pulse that is provided to the second data input 316 as the data input signal nX is provided as a data output signal $X_3$ or $X_4$ on a respective one of the outputs 330 and 332. Accordingly, the first and second propagation paths 326 and 328 correspond to gate long Josephson junctions that are coupled between an input long Josephson junction and an output long Josephson junction. Additionally, because the input signals X and nX are complementary, if the data soliton pulse is provided as one of the data output signals $X_3$ or $X_4$, then no soliton pulse is provided as either of the data output signals $X_1$ or $X_2$. Similarly, if the data soliton pulse is provided as one of the data output signals $X_1$ or $X_2$, then no soliton pulse is provided as either of the data output signals $X_3$ or $X_4$.

In the example of FIG. 3, the propagation path 306 on which the first soliton can propagate is coupled to the first propagation path 318 associated with the first data input 314 via an inductor $L_{B1}$, and is coupled to the first propagation path 326 associated with the second data input 316 via an inductor $L_{B2}$. Similarly, the propagation path 310 on which the first soliton can propagate is coupled to the second propagation path 320 associated with the first data input 314 via an inductor $L_{B3}$, and is coupled to the second propagation path 328 associated with the second data input 316 via an inductor $L_{B4}$. Therefore, the first soliton provided as the enable signal C can be provided as a bias to the gate long Josephson junctions formed by the first propagation paths 318 and 326, and the first soliton provided as the not enable signal nC can be provided as a bias to the gate long Josephson junctions formed by the second propagation paths 320 and 328.

As a first example, the enable soliton pulse can be provided to the first enable input 302 as the enable signal C and the data soliton pulse can be provided to the first data input 314 as the data signal X. For example, the soliton pulses can correspond to a logic-1, such that the not enable signal nC and the data signal nX can each correspond to a logic-0. In the first example, the enable soliton pulse provides a bias current through the inductor $L_{B1}$ to the first propagation path 318 and through the inductor $L_{B2}$ to the first propagation path 326. The bias current propagates from the inductor $L_{B1}$ to the grounded Josephson junction $J_{X1}$ and through the escape Josephson junction $J_{E1}$ in a first current direction (right-to-left in the example of FIG. 3), and can be provided through the escape Josephson junction $J_{E2}$ via the inductor $L_{S1}$ in a second current direction (left-to-right in the example of FIG. 3) opposite the first direction.

In the first example, the data soliton pulse is split at the inductor $L_{S1}$ to be provided to both of the first and second propagation paths 318 and 320 in the second direction (left-to-right). Because the data soliton pulse and the bias current provided from the inductor $L_{B1}$ are provided in opposite directions with respect to each other through the escape Josephson junction $J_{E1}$, the combined currents are insufficient to trigger the escape Josephson junction $J_{E1}$. However, because the data soliton pulse and the bias current provided from the inductor $L_{B1}$ are provided in the same direction with respect to each other through the escape Josephson junction $J_{E2}$, the combined currents exceed the critical current of the escape Josephson junction $J_{E2}$, thereby triggering the escape Josephson junction $J_{E2}$. The triggering of the escape Josephson junction $J_{E2}$ thus rejects the propagation of the data soliton pulse through the second propagation path 320. However, the data soliton pulse and the bias current from the inductor $L_{B1}$ combine through the grounded Josephson junction $J_{X1}$, triggering the grounded Josephson junction $J_{X1}$ to continue propagation of the data soliton pulse through the first propagation path 318 to provide the data soliton pulse at the output 322 as the output signal $X_1$ having a logic-1 binary state. The rejection of the data soliton pulse by the escape Josephson junction $J_{E2}$ results in no soliton pulse provided at the output 324, and thus the output signal $X_2$ has a logic-0 binary state.

In the first example, the bias current also propagates from the inductor $L_{B2}$ to the grounded Josephson junction $J_{X3}$, through the escape Josephson junction $J_{E3}$ in the first current direction, and through the escape Josephson junction $J_{E4}$ in the second current direction. However, absent the data soliton pulse at the second data input 316, none of the Josephson junctions $J_{E3}$, $J_{E4}$, $J_{X3}$, and $J_{X4}$ trigger. Therefore, no soliton pulse is provided at the outputs 330 and 332, thus providing the output signals $X_3$ and $X_4$ as each having a logic-0 state.

As a second example, the enable soliton pulse can be provided to the second enable input 304 as the enable signal nC and the data soliton pulse can be provided to the first data input 314 as the data signal X. In the second example, the enable soliton pulse provides a bias current through the inductor $L_{B3}$ to the second propagation path 320 and through the inductor $L_{B4}$ to the second propagation path 328. The bias current propagates from the inductor $L_{B3}$ to the grounded Josephson junction $J_{X2}$ and through the escape Josephson junction $J_{E2}$ in a first current direction (right-to-left in the example of FIG. 3), and can be provided through the escape Josephson junction $J_{E1}$ via the inductor $L_{S1}$ in a second current direction (left-to-right in the example of FIG. 3) opposite the first direction.

In the second example, the data soliton pulse is split at the inductor $L_{S1}$ to be provided to both of the first and second propagation paths 318 and 320 in the second direction (left-to-right). Because the data soliton pulse and the bias current provided from the inductor $L_{B3}$ are provided in opposite directions with respect to each other through the escape Josephson junction $J_{E2}$, the combined currents are insufficient to trigger the escape Josephson junction $J_{E2}$. However, because the data soliton pulse and the bias current provided from the inductor $L_{B3}$ are provided in the same direction with respect to each other through the escape Josephson junction $J_{E1}$, the combined currents exceed the critical current of the escape Josephson junction $J_{E1}$, thereby triggering the escape Josephson junction $J_{E1}$. The triggering of the escape Josephson junction $J_{E1}$ thus rejects the propagation of the data soliton pulse through the first propagation path 318. However, the data soliton pulse and the bias current from the inductor $L_{B3}$ combine through the grounded Josephson junction $J_{X2}$, triggering the grounded Josephson junction $J_{X2}$ to continue propagation of the data soliton pulse through the second propagation path 320 to provide the data soliton pulse at the output 324 as the output signal $X_2$ having a logic-1 binary state. The rejection of the data soliton pulse by the escape Josephson junction $J_{E1}$ results in no soliton pulse provided at the output 322, and thus the output signal $X_1$ has a logic-0 binary state.

In the second example, the bias current also propagates from the inductor $L_{B4}$ to the grounded Josephson junction $J_{X4}$, through the escape Josephson junction $J_{E4}$ in the first current direction, and through the escape Josephson junction $J_{E3}$ in the second current direction. However, absent the data soliton pulse at the second data input 316, none of the Josephson junctions $J_{E3}$, $J_{E4}$, $J_{X3}$, and $J_{X4}$ trigger. Therefore, no soliton pulse is provided at the outputs 330 and 332, thus providing the output signals $X_3$ and $X_4$ as each having a logic-0 state.

The operation of the long Josephson junction switch gate 300 is similar with respect to providing the data soliton pulse at the outputs 330 and 332 as the output signals $X_3$ and $X_4$, respectively, having a logic-1 state. In a third example, the enable soliton pulse is provided on the enable input 302 and the data soliton pulse is provided on the second data input 316. In the third example, the enable soliton pulse thus provides a bias to the first propagation path 326 to provide the data soliton pulse at the output 330 as the output signal $X_3$ having a logic-1 state, similar to as described above in the first example. In a fourth example, the enable soliton pulse is provided on the not enable input 304 and the data soliton pulse is provided on the second data input 316. In the fourth example, the enable soliton pulse thus provides a bias to the second propagation path 328 to provide the data soliton pulse at the output 332 as the output signal $X_4$ having a logic-1 state, similar to as described above in the second example.

Accordingly, the long Josephson junction switch gate 300 can route a data signal from one input to a plurality of outputs based on an enable signal, as described above. FIG. 4 illustrates an example of a truth table 400 of the long Josephson junction switch gate 300. The truth table 400 thus demonstrates the combination of output data signals $X_1$, $X_2$, $X_3$, and $X_4$ based on the combination of the complementary enable and not enable signals C and nC and the combination of complementary input data signals X and nX. The four combinations of the output data signals from top to bottom in the truth table 400 correspond respectively to the four examples described above.

Figures 5, 6:
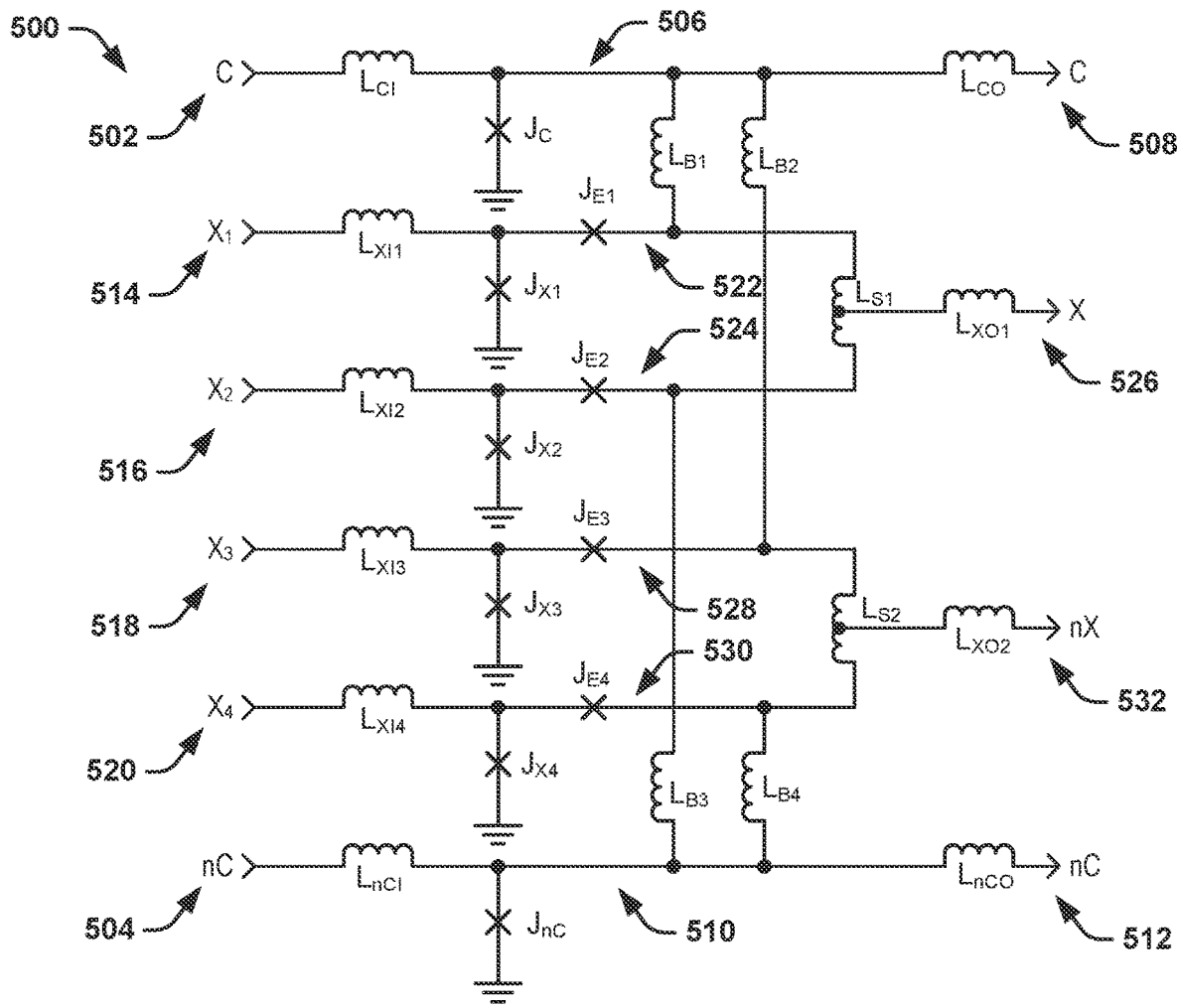
FIG. 5 illustrates an example of a long Josephson junction merge gate.
FIG. 6 illustrates an example of a truth table of a long Josephson junction merge gate.

FIG. 5 illustrates an example of a long Josephson junction merge gate 500. The long Josephson junction merge gate 500 can correspond to the long Josephson junction logic gate 102 in the example of FIG. 1, and can thus be formed from long Josephson junctions, similar to as demonstrated in the example of FIG. 2. Therefore, reference is to be made to the examples of FIGS. 1 and 2 in the following description of the example of FIG. 5. As described herein, the long Josephson junction merge gate 500 can operate in reverse of the long Josephson junction switch gate 300 in the example of FIG. 3. Accordingly, the long Josephson junction switch gate 300 and the long Josephson junction merge gate 500 are examples of logic gates that are reversible in structure, but not reversible in operation, as described herein.

The long Josephson junction merge gate 500 includes a first enable input 502 and a second enable input 504 that are configured to receive a signal C and a signal nC, respectively. The first and second enable inputs 502 and 504 can correspond to a complementary pair of enable signals, such that the signal C can correspond to an enable input and the signal nC can correspond to a not enable input. Therefore, one of the first and second enable inputs 502 and 504 can propagate an enable soliton pulse for a given logic (e.g., merge) operation. As an example, each of the first and second enable inputs 502 and 504 can be coupled to input long Josephson junctions, such as two of the input long Josephson junctions 104 in the example of FIG. 1. Therefore, the enable soliton pulse can be provided to one of the first and second enable inputs 502 and 504 from a respective one of the input long Josephson junctions 104.

The first enable input 502 is coupled to a propagation path 506 for a soliton pulse that is provided at the first enable input 502. The propagation path 506 includes an inductor $L_{CI}$, a grounded Josephson junction $J_C$, and an inductor $L_{CO}$. The inductor $L_{CO}$ is coupled to an output 508 that provides the enable signal C to an output long Josephson junction, such as one of the output long Josephson junctions 106. Similarly, the second enable input 504 is coupled to a propagation path 510 for a soliton pulse that is provided at the second enable input 504. The propagation path 510 includes an inductor $L_{nCI}$, a grounded Josephson junction $J_{nC}$, and an inductor $L_{nCO}$. The inductor $L_{nCO}$ is coupled to an output 512 that provides the not enable signal nC to an output long Josephson junction, such as a different one of the output long Josephson junctions 106. Therefore, the propagation paths 506 and 510 correspond to gate long Josephson junctions that are coupled between an input long Josephson junction and an output long Josephson junction.

The long Josephson junction merge gate 500 also includes a first data input 514 that is configured to receive a first data signal $X_1$, a second data input 516 that is configured to receive a second data signal $X_2$, a third data input 518 that is configured to receive a third data signal $X_3$, and a fourth data input 520 that is configured to receive a fourth data signal $X_4$. The data inputs 514, 516, 518, and 520 can correspond to the opposite of the data outputs 322, 324, 330, and 332 in the long Josephson junction switch gate 300. Therefore, only one of the data inputs 514, 516, 518, and 520 can propagate a data soliton pulse for a given logic (e.g., merge) operation. As an example, each of the data inputs 514, 516, 518, and 520 can be coupled to input long Josephson junctions, such as four of the input long Josephson junctions 104 in the example of FIG. 1. Therefore, the data soliton pulse can be provided to one of the data inputs 514, 516, 518, and 520 from a respective one of the input long Josephson junctions 104.

The first data input 514 is coupled to a first propagation path 522 that includes an inductor $L_{XI1}$, a grounded Josephson junction $J_{X1}$, and an escape Josephson junction $J_{E1}$. The second data input 516 is coupled to a second propagation path 524 that includes an inductor $L_{XI2}$, a grounded Josephson junction $J_{X2}$, and an escape Josephson junction $J_{E2}$. The first and second propagation paths 522 and 524 are coupled to an inductor $L_{S1}$. The inductor $L_{S1}$ is coupled to an inductor $L_{XO1}$ to provide a data output signal X on a first output 526. Therefore, as described in greater detail herein, the data soliton pulse that is provided to the first data input 514 as the data input signal $X_1$ via the first propagation path 522 or provided to the second data input 516 as the data input signal $X_2$ via the second propagation path 524 is provided as the data output signal X on the first output 526. Accordingly, the first and second propagation paths 522 and 524 correspond to gate long Josephson junctions that are coupled between an input long Josephson junction and an output long Josephson junction.

The third data input 518 is coupled to a first propagation path 528 that includes an inductor $L_{XI3}$, a grounded Josephson junction $J_{X3}$, and an escape Josephson junction $J_{E3}$. The second data input 520 is coupled to a second propagation path 530 that includes an inductor $L_{XI4}$, a grounded Josephson junction $J_{X4}$, and an escape Josephson junction $J_{E4}$. The first and second propagation paths 528 and 530 are coupled to an inductor LS2. The inductor LS2 is coupled to an inductor $L_{XO2}$ to provide a data output signal nX on a second output 532. Therefore, as described in greater detail herein, the data soliton pulse that is provided to the third data input 518 as the data input signal $X_3$ via the first propagation path 528 or provided to the fourth data input 520 as the data input signal $X_4$ via the second propagation path 530 is provided as the data output signal nX on the second output 532. Accordingly, the first and second propagation paths 528 and 530 correspond to gate long Josephson junctions that are coupled between an input long Josephson junction and an output long Josephson junction. The outputs 526 and 532 can be configured as complementary outputs, such that the output data signals X and nX can have opposite binary states with respect to each other, similar to the input data signals X and nX of the long Josephson junction switch gate 300 in the example of FIG. 3. Accordingly, the data soliton pulse is only provided on a single one of the data inputs 514, 516, 518, and 520, and is provided on one of the data outputs 526 and 532 to provide complementary data output signals X and nX, for a given logic operation (e.g., merge).

Similar to as described in the example of FIG. 3, in the example of FIG. 5, the propagation path 506 on which the first soliton can propagate is coupled to the first propagation path 522 associated with the first data input 514 via an inductor $L_{B1}$, and is coupled to the first propagation path 528 associated with the third data input 518 via an inductor $L_{B2}$. Similarly, the propagation path 510 on which the first soliton can propagate is coupled to the second propagation path 524 associated with the second data input 516 via an inductor $L_{B3}$, and is coupled to the second propagation path 530 associated with the fourth data input 520 via an inductor $L_{B4}$. Therefore, the first soliton provided as the enable signal C can be provided as a bias to the gate long Josephson junctions formed by the first propagation paths 522 and 528, and the first soliton provided as the not enable signal nC can be provided as a bias to the gate long Josephson junctions formed by the second propagation paths 524 and 530.

The logic operations of the long Josephson junction merge gate 500 are similar to as described above for the long Josephson junction switch gate 300 in the example of FIG. 3. However, in the example of FIG. 5, the source of the bias with respect to the enable soliton pulse is irrelevant, as described herein.

In a first example, the enable soliton pulse is provided on either on the enable input 502 or the enable input 504 and the data soliton pulse is provided on the first data input 514. In the first example, regardless of whether the enable soliton pulse is provided on the first enable input 502 or the second enable input 504, the bias current combines with the data soliton pulse through the grounded Josephson junction $J_{X1}$ to trigger the grounded Josephson junction $J_{X1}$, thereby continuing propagation of the data soliton pulse. The data soliton pulse and the bias provided from the enable soliton pulse are subtractively combined through the escape Josephson junction $J_{E1}$, but are additively combined through the escape Josephson junction $J_{E2}$. Therefore, in the first example, the escape Josephson junction $J_{E1}$ does not trigger, but the escape Josephson junction $J_{E2}$ does trigger to provide the data soliton pulse through the inductor $L_{XO1}$ to the output 526 as the output signal X.

In a second example, the enable soliton pulse is provided on either on the enable input 502 or the enable input 504 and the data soliton pulse is provided on the second data input 516. In the second example, regardless of whether the enable soliton pulse is provided on the first enable input 502 or the second enable input 504, the bias current combines with the data soliton pulse through the grounded Josephson junction $J_{X2}$ to trigger the grounded Josephson junction $J_{X1}$, thereby continuing propagation of the data soliton pulse. The data soliton pulse and the bias provided from the enable soliton pulse are subtractively combined through the escape Josephson junction $J_{E2}$, but are additively combined through the escape Josephson junction $J_{E1}$. Therefore, in the second example, the escape Josephson junction $J_{E2}$ does not trigger, but the escape Josephson junction $J_{E1}$ does trigger to provide the data soliton pulse through the inductor $L_{XO1}$ to the output 526 as the output signal X.

In a third example, the enable soliton pulse is provided on either on the enable input 502 or the enable input 504 and the data soliton pulse is provided on the third data input 518. In the third example, regardless of whether the enable soliton pulse is provided on the first enable input 502 or the second enable input 504, the bias current combines with the data soliton pulse through the grounded Josephson junction $J_{X3}$ to trigger the grounded Josephson junction $J_{X3}$, thereby continuing propagation of the data soliton pulse. The data soliton pulse and the bias provided from the enable soliton pulse are subtractively combined through the escape Josephson junction $J_{E3}$, but are additively combined through the escape Josephson junction $J_{E4}$. Therefore, in the third example, the escape Josephson junction $J_{E3}$ does not trigger, but the escape Josephson junction $J_{E4}$ does trigger to provide the data soliton pulse through the inductor $L_{XO2}$ to the output 532 as the output signal nX.

In a fourth example, the enable soliton pulse is provided on either on the enable input 502 or the enable input 504 and the data soliton pulse is provided on the fourth data input 520. In the fourth example, regardless of whether the enable soliton pulse is provided on the first enable input 502 or the second enable input 504, the bias current combines with the data soliton pulse through the grounded Josephson junction $J_{X4}$ to trigger the grounded Josephson junction $J_{X4}$, thereby continuing propagation of the data soliton pulse. The data soliton pulse and the bias provided from the enable soliton pulse are subtractively combined through the escape Josephson junction $J_{E4}$, but are additively combined through the escape Josephson junction $J_{E3}$. Therefore, in the fourth example, the escape Josephson junction $J_{E4}$ does not trigger, but the escape Josephson junction $J_{E3}$ does trigger to provide the data soliton pulse through the inductor $L_{XO2}$ to the output 532 as the output signal nX.

Accordingly, the long Josephson junction merge gate 500 can route a data signal from any one of a plurality of inputs to a single output that is coupled to the inputs, as described above. FIG. 6 illustrates an example of a truth table 600 of the long Josephson junction merge gate 500. The truth table 600 thus demonstrates the combination of complementary output data signals X and nX based on the combination of the complementary enable and not enable signals C and nC and the combination of input data signals $X_1$, $X_2$, $X_3$, and $X_4$. The eight combinations of the output data signals from top to bottom in the truth table 400 correspond in consecutive pairs respectively to the four examples described above.

The long Josephson junction switch gate 300 and the long Josephson junction merge gate 500 described in the respective examples of FIGS. 3 and 4 and FIGS. 5 and 6 are demonstrated as examples of four data bit gates. The examples described above correspond to use of the long Josephson junction switch and merge gates 300 and 500 as being used in complementary data applications. However, the application of the long Josephson junction switch and merge gates 300 and 500 are not limited to use in complementary data applications. For example, the long Josephson junction switch gate 300 can be used as a data fanout gate. For example, instead of the input signals X and nX being complementary, if a soliton pulse is provided on both the data inputs 314 and 316, then two soliton pulses are provided from the outputs based on the enable inputs. As another example, applications may exist where the number of bits can be greater than or fewer than four bits. One such example is demonstrated in the example of FIG. 7.

Figure 7:
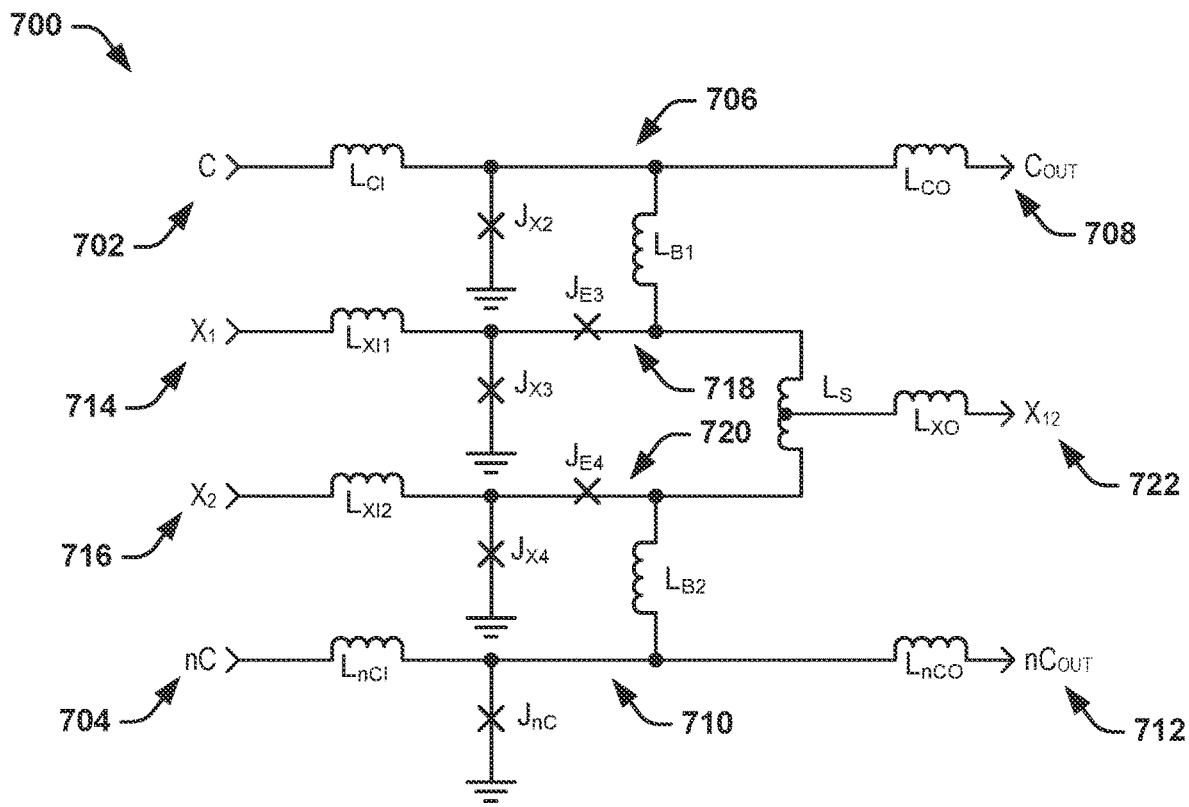
FIG. 7 illustrates another example of a long Josephson junction merge gate.

FIG. 7 illustrates another example of a long Josephson junction merge gate 700. The long Josephson junction merge gate 700 can correspond to the long Josephson junction logic gate 102 in the example of FIG. 1, and can thus be formed from long Josephson junctions, similar to as demonstrated in the example of FIG. 2. Therefore, reference is to be made to the examples of FIGS. 1 and 2 in the following description of the example of FIG. 7. The long Josephson junction merge gate 700 is demonstrated in the example of FIG. 7 as substantially the same as the long Josephson junction merge gate 500 in the example of FIG. 5, but with half the data. While the long Josephson junction merge gate 500 is a four-bit gate ("MERGE 4") with respect to inputs, the long Josephson junction merge gate 700 is a two-bit gate ("MERGE 2") with respect to inputs. The operation of the long Josephson junction merge gate 700 is thus otherwise the same as the long Josephson junction merge gate 500 in the example of FIG. 5.

The long Josephson junction merge gate 700 includes a first enable input 702 and a second enable input 704 that are configured to receive a signal C and a signal nC, respectively. Therefore, one of the first and second enable inputs 702 and 704 can propagate an enable soliton pulse for a given logic (e.g., merge) operation. The first enable input 702 is coupled to a propagation path 706 for an enable soliton pulse that is provided at the first enable input 702. The propagation path 706 includes an inductor $L_{CI}$, a grounded Josephson junction $J_C$, and an inductor $L_{CO}$. The inductor $L_{CO}$ is coupled to an output 708 that provides the enable signal C to an output long Josephson junction. Similarly, the second enable input 704 is coupled to a propagation path 710 for the enable soliton pulse that is provided at the second enable input 704. The propagation path 710 includes an inductor $L_{nCI}$, a grounded Josephson junction $J_{nC}$, and an inductor $L_{nCO}$. The inductor $L_{nCO}$ is coupled to an output 712 that provides the not enable signal nC to an output long Josephson junction.

The long Josephson junction merge gate 700 also includes a first data input 714 that is configured to receive a first data signal $X_1$ and a second data input 716 that is configured to receive a second data signal $X_2$. The first data input 714 is coupled to a first propagation path 718 that includes an inductor $L_{XI1}$, a grounded Josephson junction $J_{X1}$, and an escape Josephson junction $J_{E1}$. The second data input 716 is coupled to a second propagation path 720 that includes an inductor $L_{XT2}$, a grounded Josephson junction $J_{X2}$, and an escape Josephson junction $J_{E2}$. The first and second propagation paths 718 and 720 are coupled to an inductor $L_S$. The inductor $L_{S1}$ is coupled to an inductor $L_{XO}$ to provide a data output signal X on an output 722. Therefore, the data soliton pulse that is provided to the first data input 714 as the data input signal $X_1$ via the first propagation path 718 or provided to the second data input 716 as the data input signal $X_2$ via the second propagation path 720 is provided as the data output signal X on the output 726. The propagation path 706 is coupled to the propagation path 718 via a bias inductor $L_{B1}$ and the propagation path 710 is coupled to the propagation path 720 via a bias inductor $L_{B2}$.

The operating principles of the long Josephson junction merge gate 700 are the same as described above regarding the long Josephson junction merge gate 500 to propagate the second soliton provided on either the first data input 714 or the second data input 716 to the output 726 as the output signal X. The example of FIG. 7 thus demonstrates a two-bit long Josephson junction merge gate. A two-bit long Josephson junction switch gate could also be provided in the same manner to switch the second soliton provided at a single input to one of two outputs. Thus, a two-bit long Josephson junction switch gate that is structured as the reverse of the two-bit long Josephson junction merge gate 700 can be fabricated.

The long Josephson junction switch gates and long Josephson junction merge gates described above in the examples of FIGS. 3-7 can be combined with other gates to form more complicated gates or gates that have different combinations of inputs and outputs. As an example, a combination of merge gates can be provided to form a different input/output arrangement of long Josephson junction merge gate, as demonstrated in the example of FIG. 8. As another example, a combination of a merge gate and a switch gate can be provided to form traditional logic gates, such as AND, OR, and XOR gates, as demonstrated in the example of FIGS. 10-12. Such long Josephson junction logic gates can implement a combination of the enable inputs and the data inputs to form inputs of the traditional logic gates, as described in greater detail herein.

Figure 8:
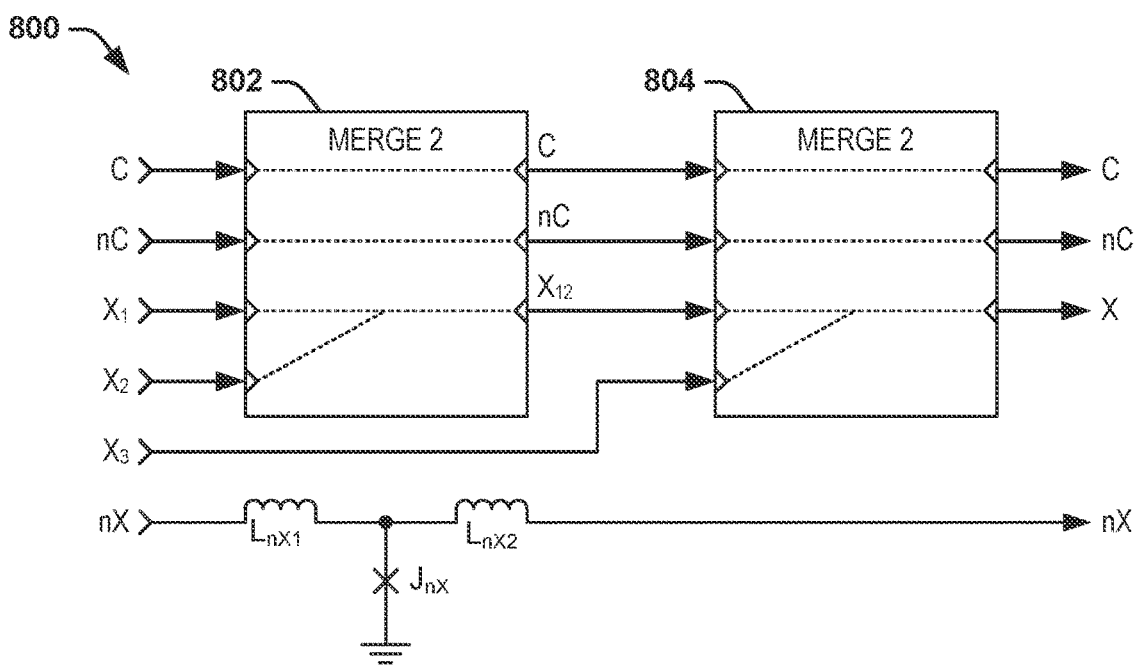
FIG. 8 illustrates yet another example of a long Josephson junction merge gate.

FIG. 8 illustrates yet another example of a long Josephson junction merge gate 800. The long Josephson junction merge gate 800 can correspond to the long Josephson junction logic gate 102 in the example of FIG. 1, and can thus be formed from long Josephson junctions, similar to as demonstrated in the examples of FIG. 2. Therefore, reference is to be made to the examples of FIGS. 1 and 2 in the following description of the example of FIG. 8. As described herein, the long Josephson junction merge gate 800 can correspond to a three-bit merge gate ("MERGE 3") to provide a soliton pulse from any one of three inputs to a single output.

The long Josephson junction merge gate 800 includes a first long Josephson junction merge gate 802 and a second long Josephson junction merge gate 804. Each of the long Josephson junction merge gates 802 and 804 are demonstrated as two-bit merge gates ("MERGE 2"), such as the long Josephson junction merge gate 700 demonstrated in the example of FIG. 7. Similar to as described above, the long Josephson junction merge gate 800 includes complementary enable and not enable inputs C and nC. The enable input C and the not enable input nC are provided to the first long Josephson junction merge gate 802 that can include a propagation path for each of the enable input C and the not enable input nC. The enable input C and the not enable input nC are thus output from the first long Josephson junction merge gate 802 and are provided to the second long Josephson junction merge gate 804. The second long Josephson junction merge gate 804 can include a propagation path for each of the enable input C and the not enable input nC. The enable input C and the not enable input nC are thus output from the second long Josephson junction merge gate 804. Thus, the enable input C and the not enable nC can each correspond to a long Josephson junction through one of which the enable soliton pulse can propagate to provide a bias current to propagation paths associated with data inputs, similar to as described above.

The long Josephson junction merge gate 800 includes four data inputs, demonstrated as $X_1$, $X_2$, $X_3$, and nX. Similar to as described above regarding the long Josephson junction merge gate 500 in the example of FIG. 5, one of the data inputs $X_1$, $X_2$, $X_3$, and nX can propagate the data soliton pulse while the other three data inputs do not propagate a soliton pulse. The first two data inputs $X_1$ and $X_2$ are provided to the first long Josephson junction merge gate 802 to correspond to the data inputs 714 and 716, respectively. The first long Josephson junction merge gate 802 can thus provide a logic merge operation on the first two data inputs $X_1$ and $X_2$ to provide an output signal $X_{12}$. Therefore, if either of the first two data inputs $X_1$ and $X_2$ receive the data soliton pulse, then the data soliton pulse is provided as the output signal $X_{12}$. However, if the data soliton pulse is provided on the input $X_3$ or the input nX, then the output signal $X_{12}$ is provided from the first long Josephson junction merge gate 802 as no soliton pulse (e.g., logic-0).

The second long Josephson junction merge gate 804 receives the output signal $X_{12}$ on a first data input (e.g., the first data input 714) and receives the input signal $X_3$ on a second data input (e.g., the second data input 716). The second long Josephson junction merge gate 804 can thus provide a logic merge operation on the two data inputs $X_{12}$ and $X_3$ to provide an output signal X that corresponds to an output signal of the long Josephson junction merge gate 800. Therefore, if either of the two data inputs $X_{12}$ and $X_3$ receive the data soliton pulse, then the data soliton pulse is provided as the output signal X. Accordingly, if the data soliton pulse is provided on any of the data inputs $X_1$, $X_2$, and $X_3$ that are provided to the three-bit long Josephson junction merge gate 800 ("MERGE 3"), then the long Josephson junction merge gate 800 provides the data soliton pulse as the output signal X to provide a merge logic operation.

The input nX is demonstrated as propagating through the long Josephson junction merge gate 800 as a long Josephson junction that is not connected to any other propagation path. Thus, the input nX is provided as an output nX from the long Josephson junction merge gate 800. The input/output nX is thus demonstrated in the example of FIG. 8 as a propagation path that includes a first inductor $L_{nX1}$, a grounded Josephson junction $J_{nX}$, and a second inductor $L_{nX2}$. The propagation path of the input/output nX can thus be coupled between other input and output long Josephson junctions. As described above, if the data soliton pulse is provided on any of the data inputs $X_1$, $X_2$, and $X_3$ that are provided to the three-bit long Josephson junction merge gate 800, then the long Josephson junction merge gate 800 provides the data soliton pulse as the output signal X. However, if the data soliton pulse is provided on the input nX, then no soliton pulse was provided on the inputs $X_1$, $X_2$, and $X_3$. As a result, the output X provides no soliton pulse (e.g., logic-0) while the output nX provides the data soliton pulse (e.g., logic-1). Accordingly, the outputs X and nX of the long Josephson junction merge gate 800 are demonstrated in the example of FIG. 8 as complementary outputs.

As described above, other logic gates can be formed as or as part of long Josephson junctions, including traditional logic gates. The examples of FIGS. 9-12 demonstrate examples of traditional long Josephson junction logic gates. As described in the examples of FIGS. 9-12, the terms "inputs", "outputs", and "signals" are used generally interchangeably, and can be discerned with reference to the above examples of FIGS. 3-8.

Figure 9:
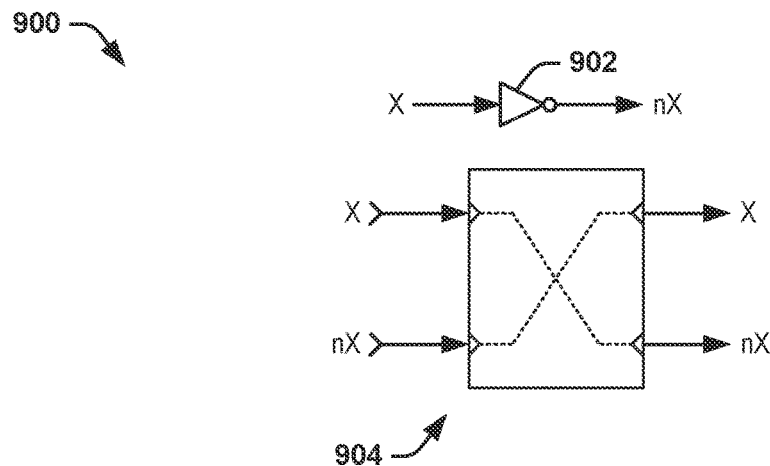
FIG. 9 illustrates an example diagram of a long Josephson junction logic NOT gate.

FIG. 9 illustrates an example diagram 900 of a long Josephson junction logic NOT gate. The diagram 900 includes a circuit symbol of the long Josephson junction logic NOT gate, which is demonstrated in the example of FIG. 9 as an inverter 902. The inverter 902 is demonstrated as receiving a data input signal X and providing a data output signal nX that is an opposite logic state as the data input signal X. The diagram 900 also includes a long Josephson junction NOT gate 904. The long Josephson junction NOT gate 904 is demonstrated as receiving a first data input signal X and a second data input signal nX that are complementary with respect to each other. The long Josephson junction NOT gate 904 provides a first data output signal nX and a second data output signal X that are likewise complementary with respect to each other. As an example, the data input signal X and the data output signal nX can be interconnected by a first long Josephson junction propagation path, and the data input signal nX and the data output signal X can be interconnected by a second long Josephson junction propagation path. Therefore, a data soliton pulse provided at the data input X is inverted by being provided as the data output signal nX, and a data soliton pulse provided at the data input nX is inverted by being provided as the data output signal X.

Figure 10:
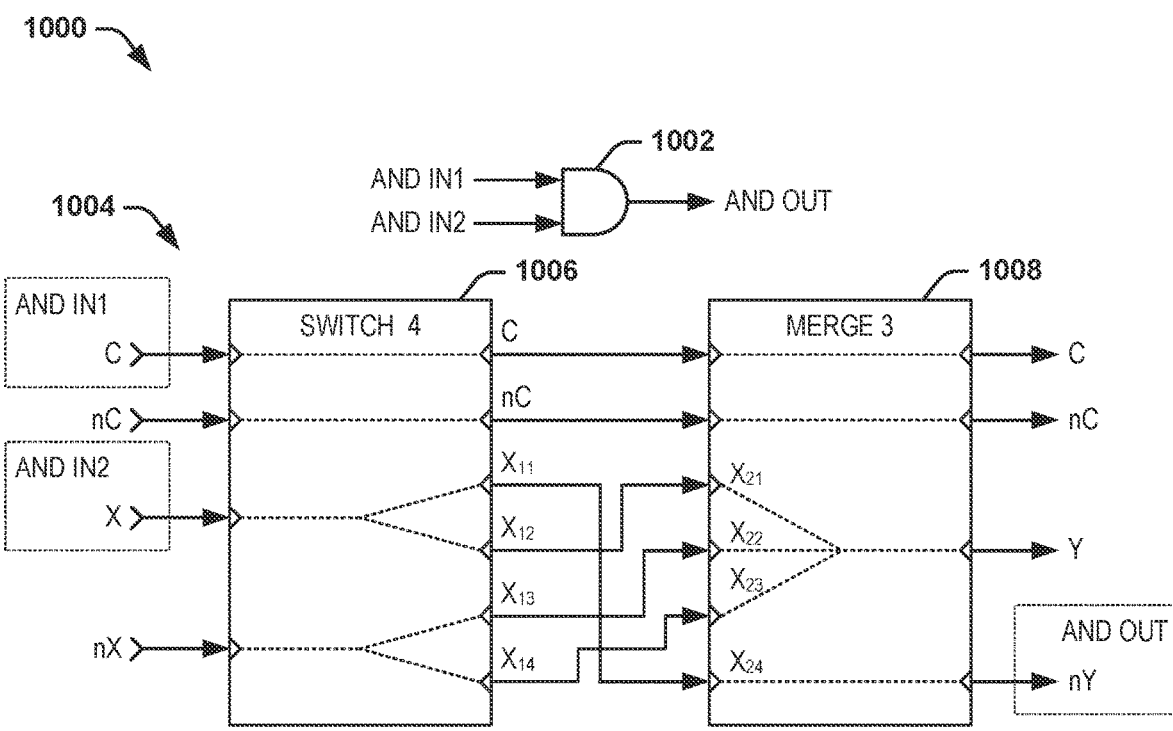
FIG. 10 illustrates an example diagram of a long Josephson junction logic AND gate.

FIG. 10 illustrates an example diagram 1000 of a long Josephson junction logic AND gate. The diagram 1000 includes a circuit symbol of the long Josephson junction logic AND gate, which is demonstrated in the example of FIG. 10 as a logic AND gate 1002. The logic AND gate 1002 is demonstrated as receiving a first data input signal AND IN1 and a second data input signal AND IN2, and providing a data output signal AND OUT that corresponds to a logic AND operation of the first and second data input signals AND IN1 and AND IN2.

The diagram 1000 also includes a long Josephson junction AND gate 1004. The long Josephson junction AND gate 1004 includes a long Josephson junction switch gate 1006 and a long Josephson junction merge gate 1008. The long Josephson junction switch gate 1006 is demonstrated as a four-bit long Josephson junction switch gate ("SWITCH 4"), such as demonstrated in the example of FIG. 3, and the long Josephson junction merge gate 1008 is demonstrated as a three-bit long Josephson junction merge gate ("MERGE 3"), such as demonstrated in the example of FIG. 8. Similar to as described above, the long Josephson junction switch gate 1006 includes complementary enable and not enable inputs C and nC that can receive an enable signal and a not enable signal that are provided on a propagation path through the long Josephson junction switch gate 1006. The enable input C and the not enable input nC are thus output from the long Josephson junction switch gate 1006 and are provided to the long Josephson junction merge gate 1008. The long Josephson junction merge gate 1008 can include a propagation path for each of the enable input C and the not enable input nC. The enable input C and the not enable input nC are thus output from the long Josephson junction merge gate 1008. Thus, the enable input C and the not enable nC can each correspond to a long Josephson junction through one of which the enable soliton pulse can propagate to provide a bias current to propagation paths associated with data inputs, similar to as described above.

The long Josephson junction switch gate 1006 includes two complementary data inputs, demonstrated as X and nX similar to as described in the example of FIG. 3. Thus, similar to as described above regarding the long Josephson junction switch gate 300 in the example of FIG. 3, one of the data inputs X and nX can propagate the data soliton pulse while the other of the data inputs X and nX does not propagate a soliton pulse. The long Josephson junction switch gate 1006 includes four data outputs $X_{11}$, $X_{12}$, $X_{13}$, and $X_{14}$ that can correspond, respectively, to the four data output signals $X_1$, $X_2$, $X_3$, and $X_4$ of the long Josephson junction switch gate 300 in the example of FIG. 3. Therefore, a data soliton pulse that is provided on the first data input X can be provided as one of the data output signals $X_{11}$ or $X_{12}$ based on the enable soliton pulse provided on the C or nC enable inputs. Similarly, a data soliton pulse that is provided on the second data input nX can be provided as one of the data output signals $X_{13}$ or $X_{14}$ based on the enable soliton pulse provided on the C or nC enable inputs.

The long Josephson junction merge gate 1008 includes four data inputs $X_{21}$, $X_{22}$, $X_{23}$, and $X_{24}$ corresponding, respectively, to the data inputs $X_1$, $X_2$, $X_3$, and nX of the long Josephson junction merge gate 800 in the example of FIG. 8. In the example of FIG. 10, the data output $X_{11}$ provided from the long Josephson junction switch gate 1006 is provided as the data input $X_{24}$ of the long Josephson junction merge gate 1008, the data output $X_{12}$ provided from the long Josephson junction switch gate 1006 is provided as the data input $X_{21}$ of the long Josephson junction merge gate 1008. As also demonstrated in the example of FIG. 10, the data output $X_{13}$ provided from the long Josephson junction switch gate 1006 is provided as the data input $X_{22}$ of the long Josephson junction merge gate 1008, the data output $X_{14}$ provided from the long Josephson junction switch gate 1006 is provided as the data input $X_{23}$ of the long Josephson junction merge gate 1008.

The long Josephson junction merge gate 1008 is configured to provide an output signal Y that corresponds to the merge of the propagation paths of the data inputs $X_{21}$, $X_{22}$, and $X_{23}$ corresponding to the data outputs $X_{12}$, $X_{13}$, and $X_{14}$, respectively, of the long Josephson junction switch gate 1006. The long Josephson junction merge gate 1008 also includes a data output nY that corresponds to the data output $X_{11}$ (e.g., as a pass-through propagation path) and is a complement of the data output Y. Accordingly, if the data soliton pulse is provided on any of the data outputs $X_{12}$, $X_{13}$, or $X_{14}$ of the long Josephson junction switch gate 1006, and thus to any of the data inputs $X_{21}$, $X_{22}$, or $X_{23}$ of the long Josephson junction merge gate 1008, then the long Josephson junction merge gate 1008 provides the data soliton pulse to the data output Y and provides no data soliton pulse to the data output nY. However, if the data soliton pulse is provided from the data output $X_{11}$ of the long Josephson junction switch gate 1006, and thus to the data input $X_{24}$ of the long Josephson junction merge gate 1008, then the long Josephson junction merge gate 1008 provides a data soliton pulse to the data output nY and provides no data soliton pulse to the data output Y.

Specific inputs of the long Josephson junction switch gate 1006 and a specific output of the long Josephson junction merge gate 1008 can be selected to correspond to the inputs and the output of the long Josephson junction logic AND gate 1004. In the example of FIG. 10, the enable input C and the data input X of the long Josephson junction switch gate 1006 can correspond, respectively, to the data inputs AND IN1 and AND IN2 of the long Josephson junction logic AND gate 1004. The data output signal nY of the long Josephson junction merge gate 1008 can correspond to the data output AND OUT of the long Josephson junction logic AND gate 1004. Additionally, because the long Josephson junction switch gate 1006 includes the complements of the both the enable input C and the data input X, and because the long Josephson junction merge gate 1008 includes a complement of the data output nY, any of the inputs and output can be inverted without any changes to the long Josephson junction logic AND gate 1004.

In a first example, if a soliton pulse (e.g., the enable soliton pulse) is provided on the enable input C of the long Josephson junction switch gate 1006 and a soliton pulse (e.g., the data soliton pulse) is provided on the data input X of the long Josephson junction switch gate 1006, then the long Josephson junction merge gate 1008 provides a soliton pulse (e.g., the data soliton pulse) at the data output nY and no soliton pulse at the data output Y. The first example thus represents a logic-1 provided to each of the data inputs AND IN1 and AND IN2 to provide a logic-1 at the data output AND OUT. In a second example, if a soliton pulse is provided on the enable input nC of the long Josephson junction switch gate 1006 and a soliton pulse is provided on the data input X of the long Josephson junction switch gate 1006, or if a soliton pulse is provided on the enable input C of the long Josephson junction switch gate 1006 and a soliton pulse is provided on the data input nX of the long Josephson junction switch gate 1006, then the long Josephson junction merge gate 1008 provides no soliton pulse at the data output nY, but instead provides the data soliton pulse from the data output Y. The second example thus represents a logic-1 provided to one of the data inputs AND IN1 and AND IN2 and a logic-0 provided to the other of the data inputs AND IN1 and AND IN2 to provide a logic-0 at the data output AND OUT. In a third example, if a soliton pulse is provided on the enable input nC of the long Josephson junction switch gate 1006 and a soliton pulse is provided on the data input nX of the long Josephson junction switch gate 1006, then the long Josephson junction merge gate 1008 provides no soliton pulse at the data output nY, but instead provides the data soliton pulse from the data output Y. The third example thus represents a logic-0 provided to each of the data inputs AND IN1 and AND IN2 to provide a logic-0 at the data output AND OUT.

Figure 11:
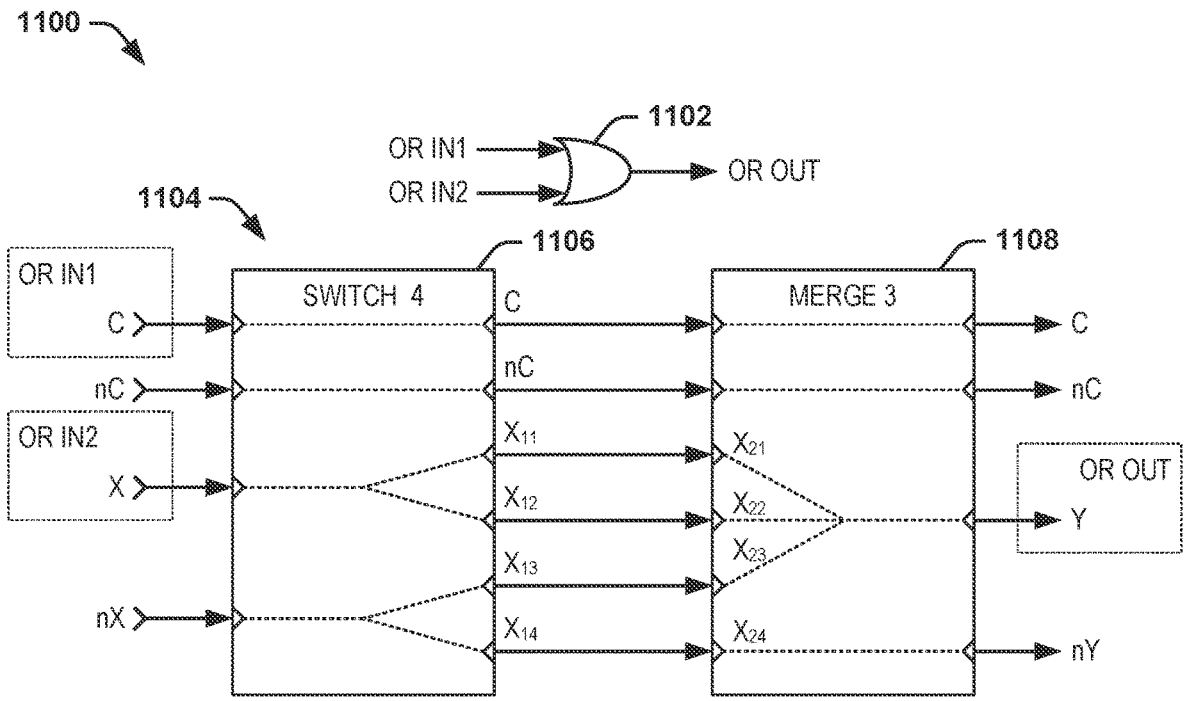
FIG. 11 illustrates an example diagram of a long Josephson junction logic OR gate.

FIG. 11 illustrates an example diagram 1100 of a long Josephson junction logic OR gate. The diagram 1100 includes a circuit symbol of the long Josephson junction logic OR gate, which is demonstrated in the example of FIG. 11 as a logic OR gate 1102. The logic OR gate 1102 is demonstrated as receiving a first data input signal OR IN1 and a second data input signal OR IN2, and providing a data output signal OR OUT that corresponds to a logic OR operation of the first and second data input signals OR IN1 and OR IN2.

The diagram 1100 also includes a long Josephson junction OR gate 1104. The long Josephson junction OR gate 1104 includes a long Josephson junction switch gate 1106 and a long Josephson junction merge gate 1108. The long Josephson junction switch gate 1106 is demonstrated as a four-bit long Josephson junction switch gate ("SWITCH 4"), such as demonstrated in the example of FIG. 3, and the long Josephson junction merge gate 1108 is demonstrated as a three-bit long Josephson junction merge gate ("MERGE 3"), such as demonstrated in the example of FIG. 8. Similar to as described above, the long Josephson junction switch gate 1106 includes complementary enable and not enable inputs C and nC that can receive an enable signal and a not enable signal that are provided on a propagation path through the long Josephson junction switch gate 1106. The enable input C and the not enable input nC are thus output from the long Josephson junction switch gate 1106 and are provided to the long Josephson junction merge gate 1108. The long Josephson junction merge gate 1108 can include a propagation path for each of the enable input C and the not enable input nC. The enable input C and the not enable input nC are thus output from the long Josephson junction merge gate 1108. Thus, the enable input C and the not enable nC can each correspond to a long Josephson junction through one of which the enable soliton pulse can propagate to provide a bias current to propagation paths associated with data inputs, similar to as described above.

The long Josephson junction switch gate 1106 includes two complementary data inputs, demonstrated as X and nX similar to as described in the example of FIG. 3. Thus, similar to as described above regarding the long Josephson junction switch gate 300 in the example of FIG. 3, one of the data inputs X and nX can propagate the data soliton pulse while the other of the data inputs X and nX does not propagate a soliton pulse. The long Josephson junction switch gate 1106 includes four data outputs $X_{11}$, $X_{12}$, $X_{13}$, and $X_{14}$ that can correspond, respectively, to the four data output signals $X_1$, $X_2$, $X_3$, and $X_4$ of the long Josephson junction switch gate 300 in the example of FIG. 3. Therefore, a data soliton pulse that is provided on the first data input X can be provided as one of the data output signals $X_{11}$ or $X_{12}$ based on the enable soliton pulse provided on the C or nC enable inputs. Similarly, a data soliton pulse that is provided on the second data input nX can be provided as one of the data output signals $X_{13}$ or $X_{14}$ based on the enable soliton pulse provided on the C or nC enable inputs.

The long Josephson junction merge gate 1108 includes four data inputs $X_{21}$, $X_{22}$, $X_{23}$, and $X_{24}$ corresponding, respectively, to the data inputs $X_1$, $X_2$, $X_3$, and nX of the long Josephson junction merge gate 800 in the example of FIG. 8. In the example of FIG. 11, the data output $X_{11}$ provided from the long Josephson junction switch gate 1106 is provided as the data input $X_{21}$ of the long Josephson junction merge gate 1108, the data output $X_{12}$ provided from the long Josephson junction switch gate 1106 is provided as the data input $X_{22}$ of the long Josephson junction merge gate 1108. As also demonstrated in the example of FIG. 11, the data output $X_{13}$ provided from the long Josephson junction switch gate 1106 is provided as the data input $X_{23}$ of the long Josephson junction merge gate 1108, the data output $X_{14}$ provided from the long Josephson junction switch gate 1106 is provided as the data input $X_{24}$ of the long Josephson junction merge gate 1108.

The long Josephson junction merge gate 1108 is configured to provide an output signal Y that corresponds to the merge of the propagation paths of the data inputs $X_{21}$, $X_{22}$, and $X_{23}$ corresponding to the data outputs $X_{11}$, $X_{12}$, and $X_{13}$, respectively, of the long Josephson junction switch gate 1106. The long Josephson junction merge gate 1108 also includes a data output nY that corresponds to the data output $X_{14}$ (e.g., as a pass-through propagation path) and is a complement of the data output Y. Accordingly, if the data soliton pulse is provided on any of the data outputs $X_{11}$, $X_{12}$, or $X_{13}$ of the long Josephson junction switch gate 1106, and thus to any of the data inputs $X_{21}$, $X_{22}$, or $X_{23}$ of the long Josephson junction merge gate 1108, then the long Josephson junction merge gate 1108 provides the data soliton pulse to the data output Y and provides no data soliton pulse to the data output nY. However, if the data soliton pulse is provided from the data output $X_{14}$ of the long Josephson junction switch gate 1106, and thus to the data input $X_{24}$ of the long Josephson junction merge gate 1108, then the long Josephson junction merge gate 1108 provides a data soliton pulse to the data output nY and provides no data soliton pulse to the data output Y.

Specific inputs of the long Josephson junction switch gate 1106 and a specific output of the long Josephson junction merge gate 1108 can be selected to correspond to the inputs and the output of the long Josephson junction logic OR gate 1104. In the example of FIG. 11, the enable input C and the data input X of the long Josephson junction switch gate 1106 can correspond, respectively, to the data inputs OR IN1 and OR IN2 of the long Josephson junction logic OR gate 1104. The data output signal Y of the long Josephson junction merge gate 1108 can correspond to the data output OR OUT of the long Josephson junction logic OR gate 1104. Additionally, because the long Josephson junction switch gate 1106 includes the complements of the both the enable input C and the data input X, and because the long Josephson junction merge gate 1108 includes the complement of the data output Y, any of the inputs and output can be inverted without any changes to the long Josephson junction logic OR gate 1104.

In a first example, if a soliton pulse (e.g., the enable soliton pulse) is provided on the enable input C of the long Josephson junction switch gate 1106 and a soliton pulse (e.g., the data soliton pulse) is provided on the data input X of the long Josephson junction switch gate 1106, then the long Josephson junction merge gate 1108 provides a soliton pulse (e.g., the data soliton pulse) at the data output Y and no soliton pulse at the data output nY. The first example thus represents a logic-1 provided to each of the data inputs OR IN1 and OR IN2 to provide a logic-1 at the data output OR OUT. In a second example, if a soliton pulse is provided on the enable input nC of the long Josephson junction switch gate 1106 and a soliton pulse is provided on the data input X of the long Josephson junction switch gate 1106, or if a soliton pulse is provided on the enable input C of the long Josephson junction switch gate 1106 and a soliton pulse is provided on the data input nX of the long Josephson junction switch gate 1106, then the long Josephson junction merge gate 1108 provides a soliton pulse at the data output Y and no soliton pulse from the data output nY. The second example thus represents a logic-1 provided to one of the data inputs OR IN1 and OR IN2 and a logic-0 provided to the other of the data inputs OR IN1 and OR IN2 to provide a logic-1 at the data output OR OUT. In a third example, if a soliton pulse is provided on the enable input nC of the long Josephson junction switch gate 1106 and a soliton pulse is provided on the data input nX of the long Josephson junction switch gate 1106, then the long Josephson junction merge gate 1108 provides no soliton pulse at the data output Y, but instead provides the soliton pulse from the data output nY. The third example thus represents a logic-0 provided to each of the data inputs OR IN1 and OR IN2 to provide a logic-0 at the data output OR OUT.

Figure 12:
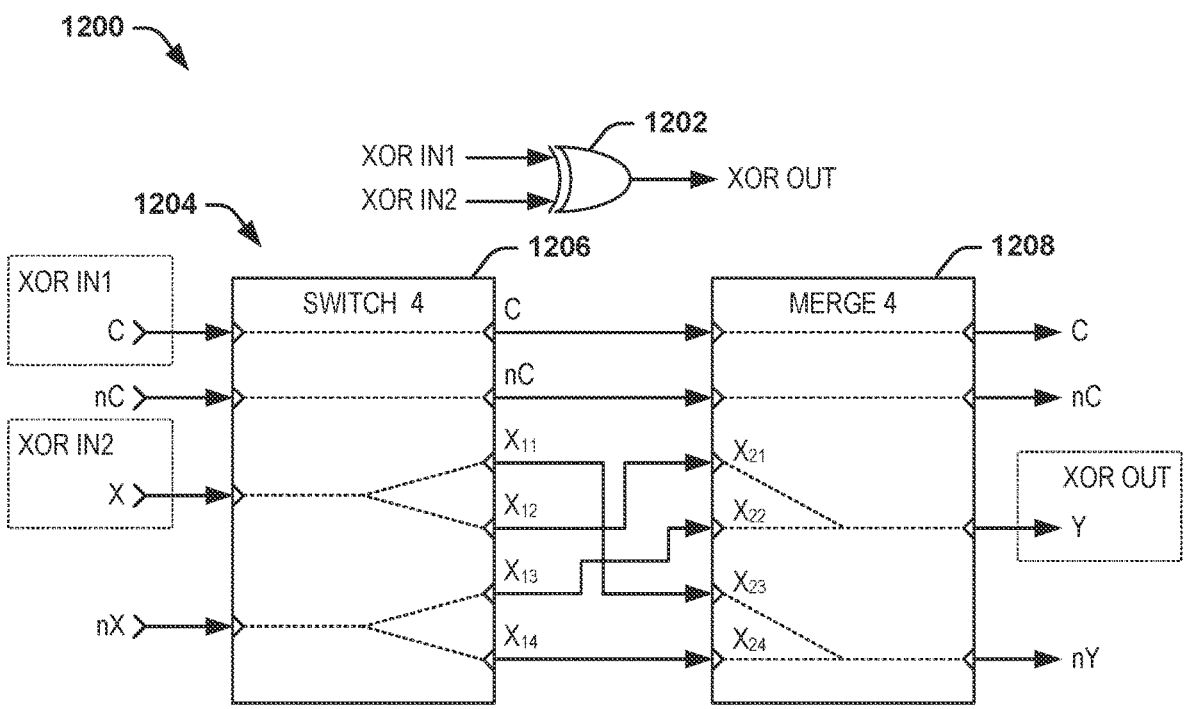
FIG. 12 illustrates an example diagram of a long Josephson junction logic XOR gate.

FIG. 12 illustrates an example diagram 1200 of a long Josephson junction logic XOR gate. The diagram 1200 includes a circuit symbol of the long Josephson junction logic XOR gate, which is demonstrated in the example of FIG. 12 as a logic XOR gate 1202. The logic XOR gate 1202 is demonstrated as receiving a first data input signal XOR IN1 and a second data input signal XOR IN2, and providing a data output signal XOR OUT that corresponds to a logic XOR operation of the first and second data input signals XOR IN1 and XOR IN2.

The diagram 1200 also includes a long Josephson junction XOR gate 1204. The long Josephson junction XOR gate 1204 includes a long Josephson junction switch gate 1206 and a long Josephson junction merge gate 1208. The long Josephson junction switch gate 1206 is demonstrated as a four-bit long Josephson junction switch gate ("SWITCH 4"), such as demonstrated in the example of FIG. 3, and the long Josephson junction merge gate 1208 is demonstrated as a four-bit long Josephson junction merge gate ("MERGE 4"), such as demonstrated in the example of FIG. 5. Similar to as described above, the long Josephson junction switch gate 1206 includes complementary enable and not enable inputs C and nC that can receive an enable signal and a not enable signal that are provided on a propagation path through the long Josephson junction switch gate 1206. The enable input C and the not enable input nC are thus output from the long Josephson junction switch gate 1206 and are provided to the long Josephson junction merge gate 1208. The long Josephson junction merge gate 1208 can include a propagation path for each of the enable input C and the not enable input nC. The enable input C and the not enable input nC are thus output from the long Josephson junction merge gate 1208. Thus, the enable input C and the not enable nC can each correspond to a long Josephson junction through one of which the enable soliton pulse can propagate to provide a bias current to propagation paths associated with data inputs, similar to as described above.

The long Josephson junction switch gate 1206 includes two complementary data inputs, demonstrated as X and nX similar to as described in the example of FIG. 3. Thus, similar to as described above regarding the long Josephson junction switch gate 300 in the example of FIG. 3, one of the data inputs X and nX can propagate the data soliton pulse while the other of the data inputs X and nX does not propagate a soliton pulse. The long Josephson junction switch gate 1206 includes four data outputs $X_{11}$, $X_{12}$, $X_{13}$, and $X_{14}$ that can correspond, respectively, to the four data output signals $X_1$, $X_2$, $X_3$, and $X_4$ of the long Josephson junction switch gate 300 in the example of FIG. 3. Therefore, a data soliton pulse that is provided on the first data input X can be provided as one of the data output signals $X_{11}$ or $X_{12}$ based on the enable soliton pulse provided on the C or nC enable inputs. Similarly, a data soliton pulse that is provided on the second data input nX can be provided as one of the data output signals $X_{13}$ or $X_{14}$ based on the enable soliton pulse provided on the C or nC enable inputs.

The long Josephson junction merge gate 1208 includes four data inputs $X_{21}$, $X_{22}$, $X_{23}$, and $X_{24}$ corresponding, respectively, to the data inputs $X_1$, $X_2$. $X_3$, and $X_4$ of the long Josephson junction merge gate 500 in the example of FIG. 5. In the example of FIG. 12, the data output $X_{11}$ provided from the long Josephson junction switch gate 1206 is provided as the data input $X_{23}$ of the long Josephson junction merge gate 1208, the data output $X_{12}$ provided from the long Josephson junction switch gate 1206 is provided as the data input $X_{21}$ of the long Josephson junction merge gate 1208. As also demonstrated in the example of FIG. 12, the data output $X_{13}$ provided from the long Josephson junction switch gate 1206 is provided as the data input $X_{22}$ of the long Josephson junction merge gate 1208, the data output $X_{14}$ provided from the long Josephson junction switch gate 1206 is provided as the data input $X_{24}$ of the long Josephson junction merge gate 1208.

The long Josephson junction merge gate 1208 is configured to provide an output signal Y that corresponds to the merge of the propagation paths of the data inputs $X_{21}$ and $X_{22}$ corresponding to the data outputs $X_{12}$ and $X_{13}$, respectively, of the long Josephson junction switch gate 1206. The long Josephson junction merge gate 1208 also includes a data output nY that corresponds to the merge of the propagation paths of the data inputs $X_{23}$ and $X_{24}$ corresponding to the data outputs $X_{11}$ and $X_{14}$, respectively, of the long Josephson junction switch gate 1206. Accordingly, if the data soliton pulse is provided on either of the data outputs $X_{12}$ or $X_{13}$ of the long Josephson junction switch gate 1206, and thus to either of the data inputs $X_{21}$ and $X_{22}$ of the long Josephson junction merge gate 1208, then the long Josephson junction merge gate 1208 provides the data soliton pulse to the data output Y and provides no data soliton pulse to the data output nY. However, if the data soliton pulse is provided on either of the data outputs $X_{11}$ or $X_{14}$ of the long Josephson junction switch gate 1206, and thus to either of the data inputs $X_{23}$ and $X_{24}$ of the long Josephson junction merge gate 1208, then the long Josephson junction merge gate 1208 provides a data soliton pulse to the data output nY and provides no data soliton pulse to the data output Y.

Specific inputs of the long Josephson junction switch gate 1206 and a specific output of the long Josephson junction merge gate 1208 can be selected to correspond to the inputs and the output of the long Josephson junction logic XOR gate 1204. In the example of FIG. 12, the enable input C and the data input X of the long Josephson junction switch gate 1206 can correspond, respectively, to the data inputs XOR IN1 and XOR IN2 of the long Josephson junction logic XOR gate 1204. The data output signal Y of the long Josephson junction merge gate 1208 can correspond to the data output XOR OUT of the long Josephson junction logic XOR gate 1204. Additionally, because the long Josephson junction switch gate 1206 includes the complements of the both the enable input C and the data input X, and because the long Josephson junction merge gate 1208 includes the complement of the data output Y, any of the inputs and output can be inverted without any changes to the long Josephson junction logic XOR gate 1204.

In a first example, if a soliton pulse (e.g., the enable soliton pulse) is provided on the enable input C of the long Josephson junction switch gate 1206 and a soliton pulse (e.g., the data soliton pulse) is provided on the data input X of the long Josephson junction switch gate 1206, then the long Josephson junction merge gate 1208 provides a soliton pulse (e.g., the data soliton pulse) at the data output nY and no soliton pulse at the data output Y. The first example thus represents a logic-1 provided to each of the data inputs XOR IN1 and XOR IN2 to provide a logic-0 at the data output XOR OUT. In a second example, if a soliton pulse is provided on the enable input nC of the long Josephson junction switch gate 1206 and a soliton pulse is provided on the data input X of the long Josephson junction switch gate 1206, or if a soliton pulse is provided on the enable input C of the long Josephson junction switch gate 1206 and a soliton pulse is provided on the data input nX of the long Josephson junction switch gate 1206, then the long Josephson junction merge gate 1208 provides a soliton pulse at the data output Y and no soliton pulse from the data output nY. The second example thus represents a logic-1 provided to one of the data inputs XOR IN1 and XOR IN2 and a logic-0 provided to the other of the data inputs XOR IN1 and XOR IN2 to provide a logic-1 at the data output XOR OUT. In a third example, if a soliton pulse is provided on the enable input nC of the long Josephson junction switch gate 1206 and a soliton pulse is provided on the data input nX of the long Josephson junction switch gate 1206, then the long Josephson junction merge gate 1208 provides no soliton pulse at the data output Y, but instead provides the soliton pulse from the data output nY. The third example thus represents a logic-0 provided to each of the data inputs XOR IN1 and XOR IN2 to provide a logic-0 at the data output XOR OUT.

The examples of FIGS. 9-12 thus demonstrate common logic gates that are implemented in computer systems, and thus demonstrates a manner in which such common logic gates can be implemented in a superconducting circuit using long Josephson junctions. The examples of gates that can be formed from the merge and switch gates are not limited to the examples of FIGS. 9-12. For example, other types of gates can be formed by combining the merge and switch gates, such as a C-Not gate, a Fredkin gate, and a Toffoli gate, as well as inverses of the gates described in the examples of FIGS. 10-12 (e.g., NAND, NOR, and NXOR gates). Therefore, as described herein, any of a variety of gates can be formed from long Josephson junctions.

By implementing the gates as long Josephson junctions instead of using JTLs, significant power savings can be achieved in the associated superconducting circuit based on circuits fabricated with long Josephson junctions requiring significantly fewer bias taps. For example, in a reciprocal quantum logic (RQL) superconducting circuit that implements a logic gate using approximately ten JTLs, an equivalent long Josephson junction logic gate can consume approximately ten times less power than the RQL JTL-based logic gate.

Figure 13:
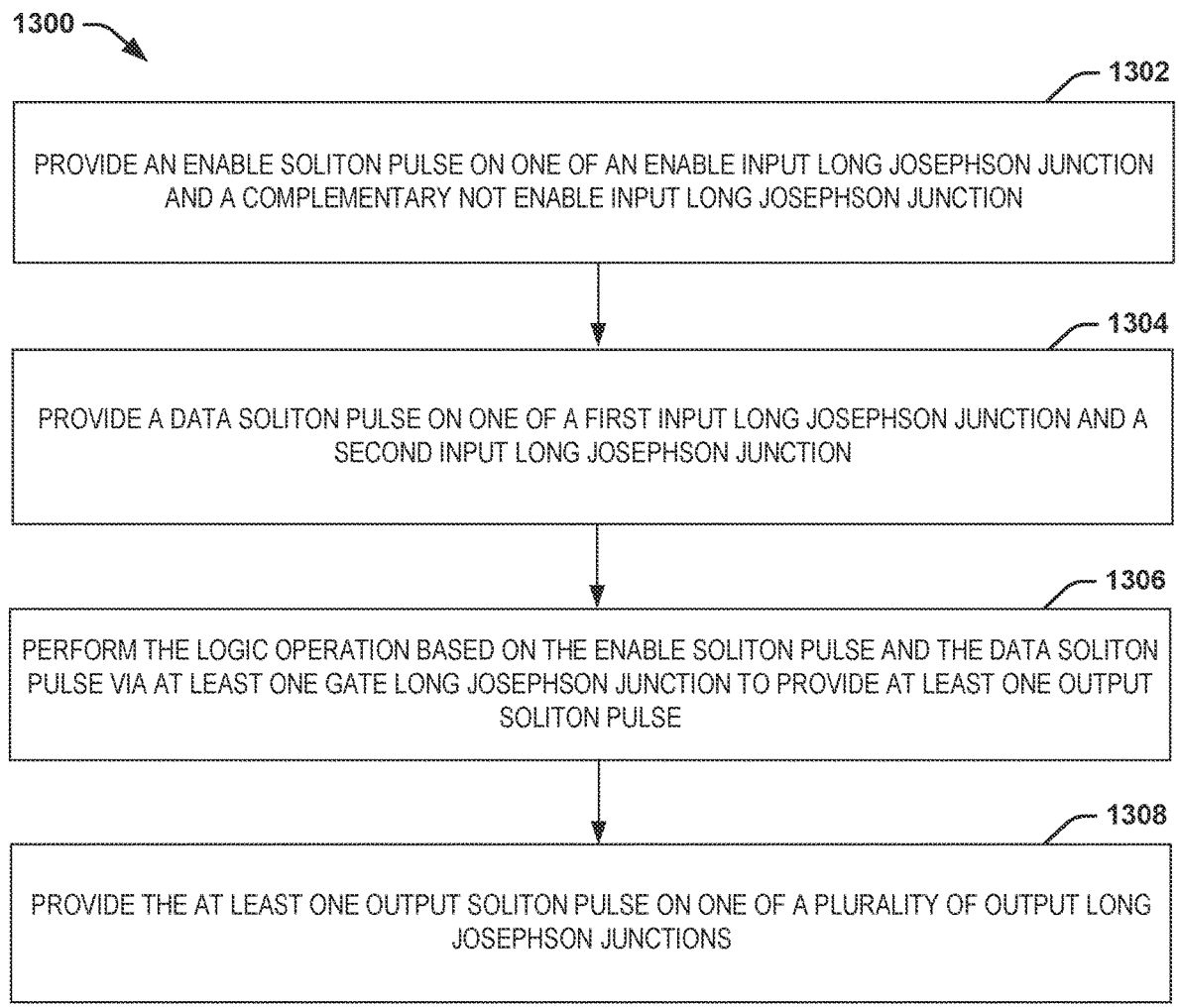
FIG. 13 illustrates an example of a method for performing a logic operation via a long Josephson junction gate system.

In view of the foregoing structural and functional features described above, a methodology in accordance with various aspects of the disclosure will be better appreciated with reference to FIG. 13. It is to be understood and appreciated that the method of FIG. 13 is not limited by the illustrated order, as some aspects could, in accordance with the present disclosure, occur in different orders and/or concurrently with other aspects from that shown and described herein. Moreover, not all illustrated features may be required to implement a methodology in accordance with an aspect of the present examples.

FIG. 13 illustrates an example of a method 1300 for performing a logic operation via a long Josephson junction gate system (e.g., the long Josephson junction logic gate system 100). At 1302, an enable soliton pulse is provided on one of an enable input long Josephson junction (e.g., an input long Josephson junction 104 to the enable input 302) and a complementary not enable input long Josephson junction (e.g., an input long Josephson junction 104 to the not enable input 304). At 1304, a data soliton pulse is provided on one of a first input long Josephson junction (e.g., an input long Josephson junction 104 to the data input 314) and a second input long Josephson junction (e.g., an input long Josephson junction 104 to the data input 316). At 1306, the logic operation is performed based on the enable soliton pulse and the data soliton pulse via at least one gate long Josephson junction (e.g., the propagation paths of one of the long Josephson junction switch gate and the long Josephson junction merge gate) to provide at least one output soliton pulse (e.g., the data soliton pulse provided to one of the data outputs of the long Josephson junction switch gate and the long Josephson junction merge gate). At 1308, the at least one output soliton pulse is provided on one of a plurality of output long Josephson junctions (e.g., an output long Josephson junction 106).

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A long Josephson junction gate system comprising:
   at least one input long Josephson junction configured to propagate a respective at least one input signal, wherein the at least one input signal is provided as a soliton pulse to correspond to a first logic state and as no soliton pulse to correspond to a second logic state;
   a long Josephson junction gate comprising at least one gate long Josephson junction configured to provide a logic operation based on the at least one input signal and to provide at least one output signal; and
   a plurality of output long Josephson junctions, at least one of the output long Josephson junctions being configured to propagate the respective at least one output signal, wherein one of the at least one input long Josephson junction, one of the at least one gate long Josephson junction, and one of the output long Josephson junctions are contiguously coupled to form a contiguous long Josephson junction through the long Josephson junction gate system, such that the at least one input signal is provided as the soliton pulse at the respective one of the at least one input long Josephson junction and propagates through the contiguous long Josephson junction.

2. The system of claim 1, wherein the long Josephson junction gate comprises at least one of:
   a switch gate configured to provide the soliton pulse from one of the input long Josephson junctions to one of the output long Josephson junctions that are coupled to the respective one of the input long Josephson junctions; and
   a merge gate configured to provide the soliton pulse from one of a plurality of the input long Josephson junctions to one of the output long Josephson junctions that is coupled to the plurality of the input long Josephson junctions.

3. The system of claim 1, wherein the at least one input long Josephson junction comprises a plurality of input long Josephson junctions, wherein the at least one gate long Josephson junction comprises a plurality of gate long Josephson junctions, wherein at least one of the input long Josephson junctions provides a bias to a plurality of the gate long Josephson junctions to select a propagation path of the soliton pulse provided on one of the input long Josephson junctions to propagate through one of the gate long Josephson junctions and one of the output long Josephson junctions.

4. The system of claim 3, wherein the input long Josephson junctions comprise a pair of complementary input long Josephson junctions, wherein the at least one pair of complementary input long Josephson junctions comprises an enable input and a not enable input, wherein one of the pair of complementary input long Josephson junctions provides the bias to the plurality of the gate long Josephson junctions to select the propagation path of the soliton pulse provided on one of the input long Josephson junctions to propagate through one of the gate long Josephson junctions and one of the output long Josephson junctions.

5. The system of claim 4, wherein the long Josephson junction gate system comprises a switch gate configured to provide the soliton pulse from one of the input long Josephson junctions to one of the output long Josephson junctions that are coupled to the respective one of the input long Josephson junctions based on respective logic states of the pair of complementary input long Josephson junctions.

6. The system of claim 5, wherein the long Josephson junction gate system further comprises at least one other long Josephson junction gate coupled to the output long Josephson junctions of the switch gate, such that the long Josephson junction gate system is configured as one of a logic AND gate, a logic OR gate, and a logic XOR gate.

7. The system of claim 4, wherein the long Josephson junction gate system comprises a merge gate configured to provide the soliton pulse from one of a plurality of the input long Josephson junctions to one of the output long Josephson junctions that is coupled to the plurality of the input long Josephson junctions based on the bias provided by the pair of complementary input long Josephson junctions.

8. The system of claim 7, wherein the long Josephson junction gate system further comprises at least one other long Josephson junction gate coupled to the input long Josephson junctions of the merge gate, such that the long Josephson junction gate system is configured as one of a logic AND gate, a logic OR gate, and a logic XOR gate.

9. A method for performing a logic operation via a long Josephson junction gate system, the method comprising:
   providing an enable soliton pulse on one of an enable input long Josephson junction and a complementary not enable input long Josephson junction;
   providing a data soliton pulse on one of a first input long Josephson junction and a second input long Josephson junction;
   performing the logic operation based on the enable soliton pulse and the data soliton pulse via at least one gate long Josephson junction to provide at least one output soliton pulse; and
   providing the at least one output soliton pulse on one of a plurality of output long Josephson junctions, wherein one of the first and second input long Josephson junctions, one of the at least one gate long Josephson junction, and one of the output long Josephson junctions are contiguously coupled to form a contiguous long Josephson junction through the long Josephson junction gate system, such that the data soliton pulse is provided at the respective one of the first and second input long Josephson junctions and propagates through the contiguous long Josephson junction.

10. The method of claim 9, wherein performing the logic operation comprises one of:
    performing a switch operation to provide the data soliton pulse from the one of the first and second input long Josephson junctions to the one of the plurality of the output long Josephson junctions that is coupled to the respective one of the first and second input long Josephson junctions based on the enable soliton pulse; and
    performing a merge operation to provide the data soliton pulse from one of the first input long Josephson junction, the second input long Josephson junction, and a third input long Josephson junction to one of the plurality of the output long Josephson junctions that is coupled to the first, second, and third input long Josephson junctions based on the enable soliton pulse.

11. The method of claim 9, wherein performing the logic operation comprises performing one of a logic AND operation, a logic OR operation, or a logic XOR operation via a first input signal corresponding to the enable soliton pulse provided on one of the enable input long Josephson junction or the not enable input long Josephson junction and the data soliton pulse provided on one of the first input long Josephson junction and the second input long Josephson junction.

12. The method of claim 9, wherein one of the first and second input long Josephson junction, one of the at least one gate long Josephson junction, and one of the at least one output long Josephson junction are contiguously coupled to form a contiguous long Josephson junction through the long Josephson junction gate system, wherein providing the data soliton pulse comprises providing the data soliton pulse to propagate through the contiguous long Josephson junction.

13. The method of claim 9, wherein the at least one gate long Josephson junction comprises a plurality of gate long Josephson junctions, wherein the at least one output long Josephson junction comprises a plurality of output long Josephson junctions, wherein providing the enable soliton pulse comprises providing the enable soliton pulse on one of the enable input long Josephson junction and the complementary not enable input long Josephson junction to provide a bias to one of the gate long Josephson junctions to select a propagation path of the data soliton pulse to propagate through the respective one of the gate long Josephson junctions and one of the output long Josephson junctions.

14. A long Josephson junction gate system comprising:
a pair of complementary long Josephson junctions corresponding respectively to an enable input and a not enable input, wherein one of the pair of complementary long Josephson junctions is configured to receive an enable soliton pulse;
a plurality of input data long Josephson junctions configured to propagate a respective plurality of input signals, each of the input signals being provided as a soliton pulse to correspond to a first logic state and as no soliton pulse to correspond to a second logic state, wherein a data soliton pulse is provided on one of the input data long Josephson junctions;
a long Josephson junction gate comprising a plurality of gate long Josephson junctions configured to provide a logic operation on the input signals based on a bias provided by one of the enable input or the not enable input to the gate long Josephson junctions to provide a plurality of output signals; and
a plurality of output long Josephson junctions configured to propagate the respective output signals, at least one of the output signals being provided as an output soliton pulse, wherein one of the input long Josephson junctions, one of the gate long Josephson junctions, and one of the output long Josephson junctions are contiguously coupled to form a contiguous long Josephson junction through the long Josephson junction gate system, such that the input signals are provided as respective soliton pulses at the respective input long Josephson junctions and propagate through the contiguous long Josephson junction.

15. The system of claim 14, wherein the long Josephson junction gate comprises at least one of:
a switch gate configured to provide a soliton pulse from one of the input long Josephson junctions to one of a plurality of the output long Josephson junctions that are coupled to the respective one of the input long Josephson junctions; and
a merge gate configured to provide the soliton pulse from one of a plurality of the input long Josephson junctions to one of the output long Josephson junctions that is coupled to the plurality of the input long Josephson junctions.

16. The system of claim 15, wherein the long Josephson junction gate system comprises the switch gate and at least one other long Josephson junction gate coupled to the output long Josephson junctions of the switch gate, such that the long Josephson junction gate system is configured as one of a logic AND gate, a logic OR gate, and a logic XOR gate.

17. The system of claim 15, wherein the long Josephson junction gate system comprises the merge gate and at least one other long Josephson junction gate coupled to the input long Josephson junctions of the merge gate, such that the long Josephson junction gate system is configured as one of a logic AND gate, a logic OR gate, and a logic XOR gate.

* * * * *